United States Patent
Kimura et al.

(10) Patent No.: US 11,366,079 B2
(45) Date of Patent: Jun. 21, 2022

(54) MEASUREMENT DEVICE AND MEASUREMENT METHOD

(71) Applicants: National University Corporation Kobe University, Hyogo (JP); INTEGRAL GEOMETRY SCIENCE INC., Hyogo (JP)

(72) Inventors: Kenjiro Kimura, Hyogo (JP); Noriaki Kimura, Hyogo (JP)

(73) Assignees: NATIONAL UNIVERSITY CORPORATION KOBE UNIVERSITY, Hyogo (JP); INTEGRAL GEOMETRY SCIENCE INC., Hyogo (JP)

( * ) Notice: Subject to any disclaimer, the term of this patent is extended or adjusted under 35 U.S.C. 154(b) by 414 days.

(21) Appl. No.: 16/096,930

(22) PCT Filed: Mar. 6, 2017

(86) PCT No.: PCT/JP2017/008710
§ 371 (c)(1),
(2) Date: Oct. 26, 2018

(87) PCT Pub. No.: WO2017/187791
PCT Pub. Date: Nov. 2, 2017

(65) Prior Publication Data
US 2019/0120796 A1 Apr. 25, 2019

(30) Foreign Application Priority Data
Apr. 28, 2016 (JP) .............................. JP2016-090128

(51) Int. Cl.
*G01R 33/10* (2006.01)
*G01R 33/02* (2006.01)
(Continued)

(52) U.S. Cl.
CPC ......... *G01N 27/9006* (2013.01); *G01N 27/72* (2013.01); *G01R 33/0206* (2013.01); *G01R 33/09* (2013.01); *G01R 33/10* (2013.01)

(58) Field of Classification Search
CPC .... G01N 27/9006; G01N 27/72; G01N 27/82; G01R 33/0206; G01R 33/09; G01R 33/10
See application file for complete search history.

(56) References Cited

U.S. PATENT DOCUMENTS 6,227,023 B1 * 5/2001 Daehn ................... B21D 26/06
72/57
6,366,085 B1 4/2002 Yeshurun et al.
(Continued)

FOREIGN PATENT DOCUMENTS

JP    6-169895      6/1994
JP    2004-500689   1/2004
(Continued)

OTHER PUBLICATIONS

Novotny, Lukas, "Lecture Notes on Electromagnetic Fields and Waves", Feb. 9, 2013; UTH Zurich, Photonics Laboratory; p. 16, 27, 42-45 (Year: 2013).*
(Continued)

*Primary Examiner* — Tarun Sinha
*Assistant Examiner* — Yossef Korang-Beheshti
(74) *Attorney, Agent, or Firm* — Wenderoth, Lind & Ponack, L.L.P.

(57) ABSTRACT

A measurement device applies a pulse current or a current of a plurality of frequencies to a laminated body having a plurality of layers having different electrical conductivities. The device acquires in-plane distribution information indicating distribution of a magnetic field of a first plane outside the laminated body. A processor generates three-dimensional magnetic field distribution information indicating a three-
(Continued)

dimensional distribution of magnetic field on an outside of the laminated body based on the in-plane distribution information, and generates information on an inside of the laminated body by processing the three-dimensional magnetic field distribution information on the outside of the laminated body. The in-plane distribution information includes information indicating response characteristics to a change in the current applied by the current applying unit. In addition, the three-dimensional magnetic field distribution information on the outside of the laminated body includes frequency characteristics of the magnetic field.

11 Claims, 8 Drawing Sheets

(51) Int. Cl.
*G01N 27/90* (2021.01)
*G01R 33/09* (2006.01)
*G01N 27/72* (2006.01)

(56) References Cited

U.S. PATENT DOCUMENTS

| | | | |
|---|---|---|---|
| 6,815,117 | B2 | 11/2004 | Hauer |
| 8,536,862 | B2 | 9/2013 | Kimura et al. |
| 2003/0020454 | A1 | 1/2003 | Hauer |
| 2006/0061357 | A1* | 3/2006 | Uyehara ............ G01N 27/9006 324/240 |
| 2006/0097718 | A1* | 5/2006 | Schlicker ............. G01N 27/023 324/228 |
| 2010/0207620 | A1* | 8/2010 | Gies .................... G01N 27/9006 324/240 |
| 2010/0219819 | A1 | 9/2010 | Kimura et al. |
| 2012/0148880 | A1 | 6/2012 | Schaefer et al. |
| 2013/0241541 | A1* | 9/2013 | Endo ..................... G01N 27/87 324/232 |
| 2014/0081584 | A1 | 3/2014 | Kimura |
| 2016/0018484 | A1 | 1/2016 | Kimura |
| 2017/0016963 | A1 | 1/2017 | Kimura et al. |

FOREIGN PATENT DOCUMENTS

| | | | |
|---|---|---|---|
| JP | 2008243439 | A * | 10/2008 |
| JP | 2012-524385 | | 10/2012 |
| JP | 2015-179028 | | 10/2015 |
| WO | 2008/123432 | | 10/2008 |
| WO | 2015/136931 | | 9/2015 |

OTHER PUBLICATIONS

Extended European Search Report dated Nov. 20, 2019 in corresponding European Patent Application No. 17789080.3.
International Search Report dated May 30, 2017 in International (PCT) Application No. PCT/JP2017/008710.
Yuki Mima et al., "Failure analysis of electric circuit board by high resolution magnetic field microscopy", 2013 IEE 3rd CPMT Symposium Japan, 2013.

* cited by examiner

Q IS A VECTOR

MEASUREMENT DEVICE AND MEASUREMENT METHOD

TECHNICAL FIELD

The present invention relates to a measurement device and a measurement method.

BACKGROUND ART

In recent years, technologies for inspecting a defect of a battery, an electronic element, and the like have been developed. For example, nondestructively specifying a defect occurring inside a lithium battery and the like is also important for specifying a cause of failure.

For example, in Patent Document 1, matters that a state of a battery is nondestructively inspected using infrared rays, visible rays, X-rays, gamma rays, ultrasonic waves, and the like and is evaluated in combination with a comparison value are described.

For example, in Patent Document 2, a method of deriving internal electrical conductivity distribution from the result of measuring a magnetic field outside the battery.

RELATED DOCUMENTS

Patent Documents

[Patent Document 1] PCT Japanese Translation Patent Publication No. 2012-524385
[Patent Document 2] Pamphlet of International Publication No. WO 2015/136931

SUMMARY OF THE INVENTION

Technical Problem

However, with the method of Patent Document 1, it is difficult to analyze the inspection result in a state where there is no comparison value.

Also, with the method of Patent Document 2, it is difficult to evaluate the inside of a structure in which many layers are laminated.

An object of the present invention is to provide a measurement device and a measurement method for obtaining information on an inside of a laminated body by using a magnetic field.

Solution to Problem

According to the present invention, there is provided a measurement device including a current applying unit which applies a pulse current or a current of a plurality of frequencies to a laminated body having a structure in which a plurality of layers having different electrical conductivities from each other are laminated, an acquisition unit which acquires in-plane distribution information including at least information indicating distribution of a magnetic field of a first plane outside the laminated body, and a processing unit which generates three-dimensional magnetic field distribution information indicating a three-dimensional distribution of magnetic field on an outside of the laminated body based on the in-plane distribution information and generates information on an inside of the laminated body by processing the three-dimensional magnetic field distribution information on the outside of the laminated body, in which the in-plane distribution information includes frequency dependent complex data which is information indicating response characteristics to a change in current applied by the current applying unit, the three-dimensional magnetic field distribution information on the outside of the laminated body includes frequency characteristics of a magnetic field, the processing unit specifies a position including depth information of a defect inside the laminated body based on the three-dimensional magnetic field distribution information on the outside of the laminated body, a boundary condition between the magnetic fields inside and outside the laminated body, and an equation relating to the magnetic field inside the laminated body, and the equation is an averaged and continuous diffusion type partial differential equation of the laminated body.

According to the present invention, there is provided a measurement method including applying a pulse current or a current of a plurality of frequencies to a laminated body having a structure in which a plurality of layers having different electrical conductivities from each other are laminated, acquiring in-plane distribution information including at least information indicating distribution of a magnetic field of a first plane outside the laminated body, generating three-dimensional magnetic field distribution information indicating a three-dimensional distribution of magnetic field on an outside of the laminated body based on the in-plane distribution information and generating information on an inside of the laminated body by processing the three-dimensional magnetic field distribution information on the outside of the laminated body, in which the in-plane distribution information includes frequency dependent complex data which is information indicating response characteristics to a change in current applied to the laminated body, the three-dimensional magnetic field distribution information on the outside of the laminated body includes frequency characteristics of a magnetic field, in the generating of the information on the inside of the laminated body, a position including depth information of a defect inside the laminated body is specified based on the three-dimensional magnetic field distribution information on the outside of the laminated body, a boundary condition between the magnetic fields inside and outside the laminated body, and an equation relating to the magnetic field inside the laminated body, and the equation is an averaged and continuous diffusion type partial differential equation of the laminated body.

Advantageous Effects of Invention

According to the present invention, it is possible to obtain information on an inside of the laminated body by using a magnetic field.

BRIEF DESCRIPTION OF THE DRAWINGS

The object described above and other objects, features and advantages will become more apparent from the following description of the preferred embodiments and the accompanying drawings.

DESCRIPTION OF EMBODIMENTS

Figure 1:
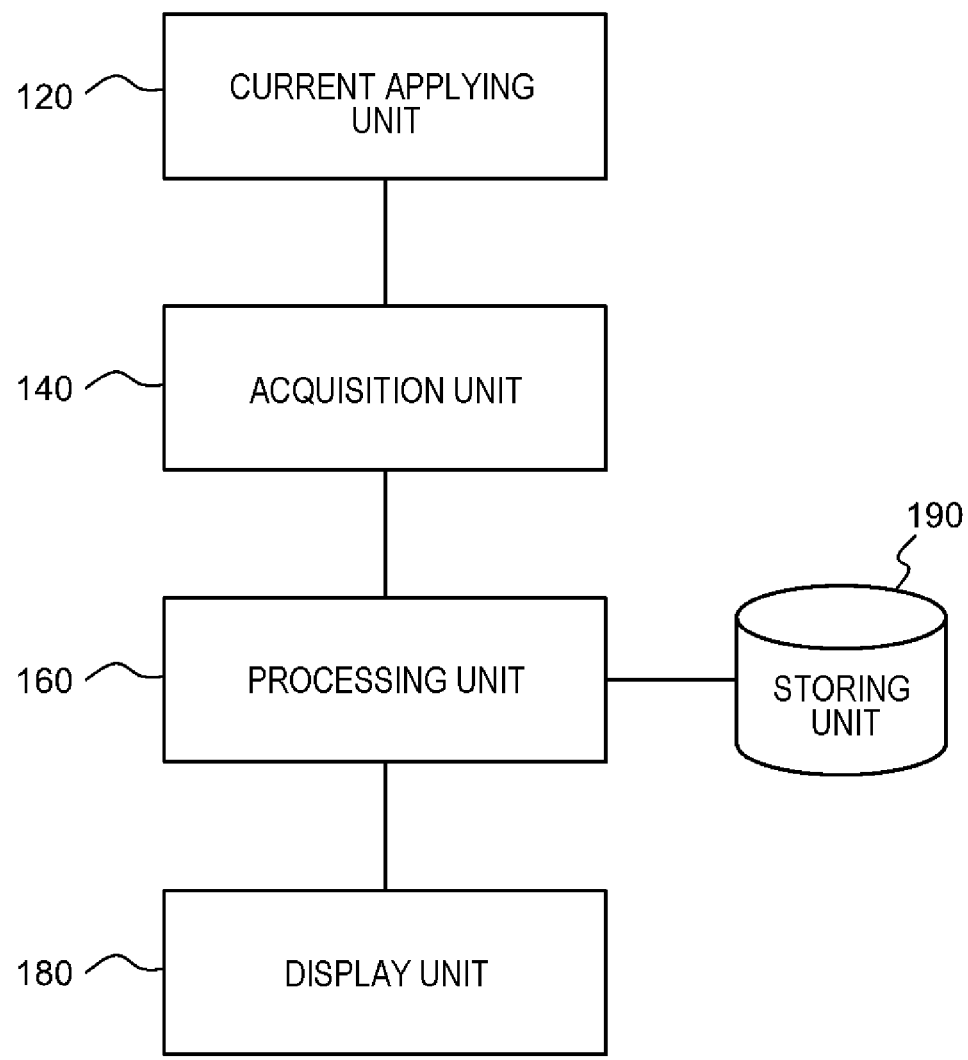
FIG. 1 is a block diagram illustrating a functional configuration of a measurement device according to a first embodiment.

Hereinafter, embodiments of the present invention will be described with reference to the drawings. In all the drawings, similar constitutional elements are denoted by the same reference numerals, and description thereof is omitted as appropriate.

In the following description, a current applying unit 120, an acquisition unit 140, a processing unit 160, a display unit 180, a storing unit 190, an outside three-dimensional distribution generation unit 162, an inside three-dimensional distribution generation unit 164, and a defect specifying unit 166 of a measurement device 10 illustrate not hardware units but blocks of functional units. The current applying unit 120, the acquisition unit 140, the processing unit 160, the display unit 180, the storing unit 190, the outside three-dimensional distribution generation unit 162, the inside three-dimensional distribution generation unit 164, and the defect specifying unit 166 of the measurement device 10 are realized by any combination of hardware and software, mainly on a CPU, a memory, a program loaded into the memory realizing constituent elements in these figures, a storage medium such as a hard disk storing the program, and a network connection interface of any computer. There are various modifications to the implementation method and apparatus.

In the following description, a bold character indicating a vector in a mathematical expression may be represented by characters that are not bold in the sentence.

First Embodiment

FIG. 1 is a block diagram illustrating a functional configuration of the measurement device 10 according to a first embodiment. The measurement device 10 includes the current applying unit 120, the acquisition unit 140, and the processing unit 160. The current applying unit 120 applies a pulse current or a current having a plurality of frequencies to a laminated body having a structure in which a plurality of layers having different electrical conductivities from each other are laminated. The acquisition unit 140 acquires in-plane distribution information including at least information indicating a distribution of a magnetic field of a first plane outside the laminated body. The processing unit 160 generates three-dimensional magnetic field distribution information indicating a three-dimensional distribution of magnetic field on an outside of the laminated body based on the in-plane distribution information, and generates information on the inside of the laminated body by processing the three-dimensional magnetic field distribution information on the outside of the laminated body. Here, the in-plane distribution information includes information indicating a response characteristic to a change in current applied by the current applying unit 120. The three-dimensional magnetic field distribution information on the outside of the laminated body includes a frequency characteristic of the magnetic field. In the following, description will be made in detail.

The measurement device 10 according to the present embodiment further includes a display unit 180. The display unit 180 displays information on the inside of the laminated body generated by the processing unit 160. However, the measurement device 10 may not include the display unit 180, and the processing unit 160 may output data indicating the information on the inside of the laminated body to another device, for example.

The measurement device 10 according to the present embodiment further includes the storing unit 190. However, the storing unit 190 may be an external memory or the like separately provided from the measurement device 10. The processing unit 160 can read out information and the like illustrating mathematical expressions to be described later from the storing unit 190 and use the information and the like for processing.

Figure 2:
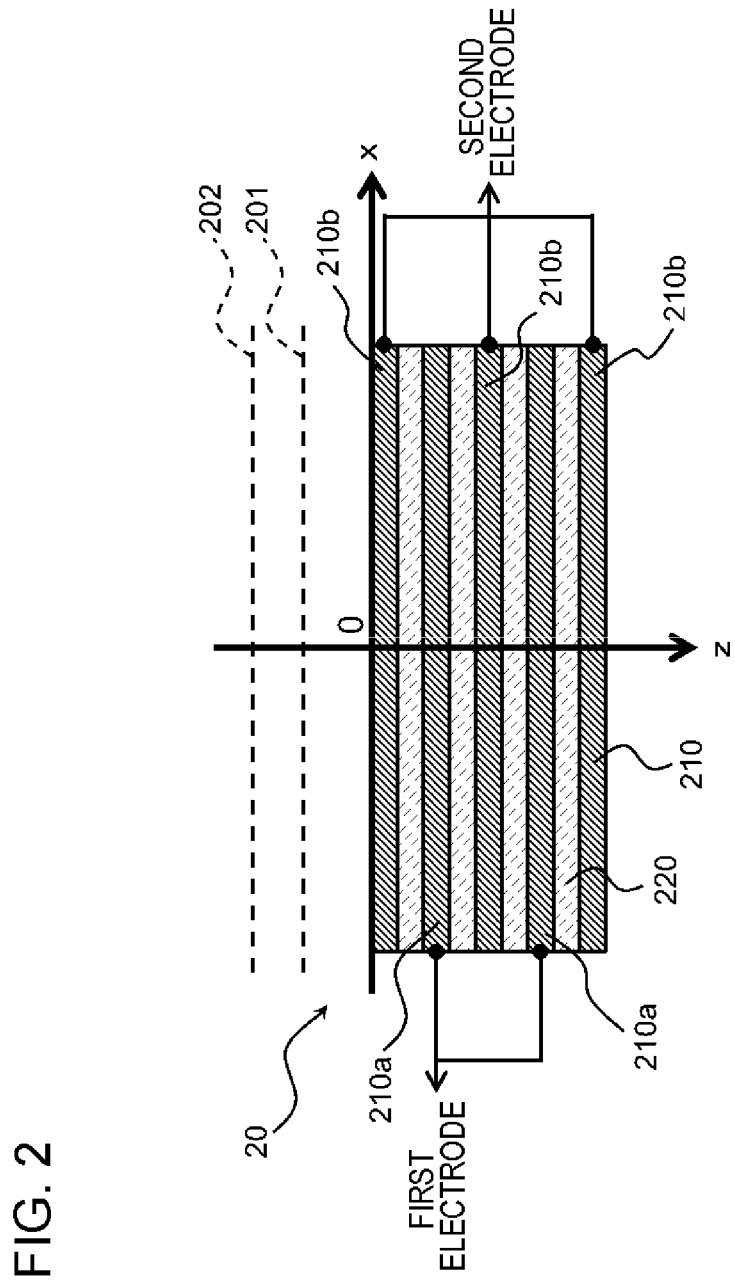
FIG. 2 is a cross-sectional view illustrating an example of a structure of a laminated body according to the first embodiment.

FIG. 2 is a cross-sectional view illustrating an example of a structure of a laminated body 20 according to the present embodiment. In the example of this figure, the laminated body 20 is a battery such as a lithium battery, for example. In a case where the laminated body 20 is, for example, a battery, the laminated body 20 has a structure in which a first layer 210 and a second layer 220 having different electrical conductivities from each other are alternately laminated. Both the first layer 210 and the second layer 220 are planar. For example, the first layer 210 is a conductor layer and the second layer 220 is an electrolyte layer. The first layer 210 may be composed of a single layer, or an electrode composed of a plurality of layers having different materials from each other. In addition, the first layer 210 includes a positive electrode 210a and a negative electrode 210b containing different materials from each other. The electrical conductivities of the positive electrode 210a and the negative electrode 210b need not be perfectly identical, but the electrodes are approximately the same, and each of the electrodes functions as an electrode. The positive electrode 210a and the negative electrode 210b are alternately disposed. That is, each of the second layers 220 is sandwiched between the positive electrode 210a and the negative electrode 210b. In the example of this figure, the laminated body 20 includes a plurality of positive electrodes 210a and a plurality of negative electrodes 210b. The plurality of positive electrodes 210a are connected to a first electrode 203a (see FIG. 3) to be described later, and the plurality of negative electrodes 210b are connected to a second electrode 203b (see FIG. 3) to be described later. The laminated body 20 may be further covered with a protective layer or the like.

Here, when it is assumed that two directions parallel to the first layer 210 and orthogonal to each other are the x-direction and the y-direction and a direction perpendicular to the x-direction and y-direction is the z-direction, a first plane 201 is a plane parallel to the xy-plane. In the example of this figure, one surface of the laminated body 20 is set to z=0, and the direction toward the inside of the laminated body 20 is set as the positive direction of the z-axis.

In the present embodiment, the in-plane distribution information includes information indicating the distribution of the magnetic field on the first plane 201 and information indicating the distribution of the magnetic field on the second plane 202. Each of the first plane 201 and the second plane 202 is a plane outside the laminated body 20, the second plane 202 is parallel to the first plane 201 and the z-coordinate thereof is different from the z-coordinate of the first plane 201. A magnitude relation between the z-coordinates of the first plane 201 and the second plane 202 is not particularly limited. In the example of this figure, the z-coordinates of the first plane 201 and the second plane 202 are both negative.

Figure 3:
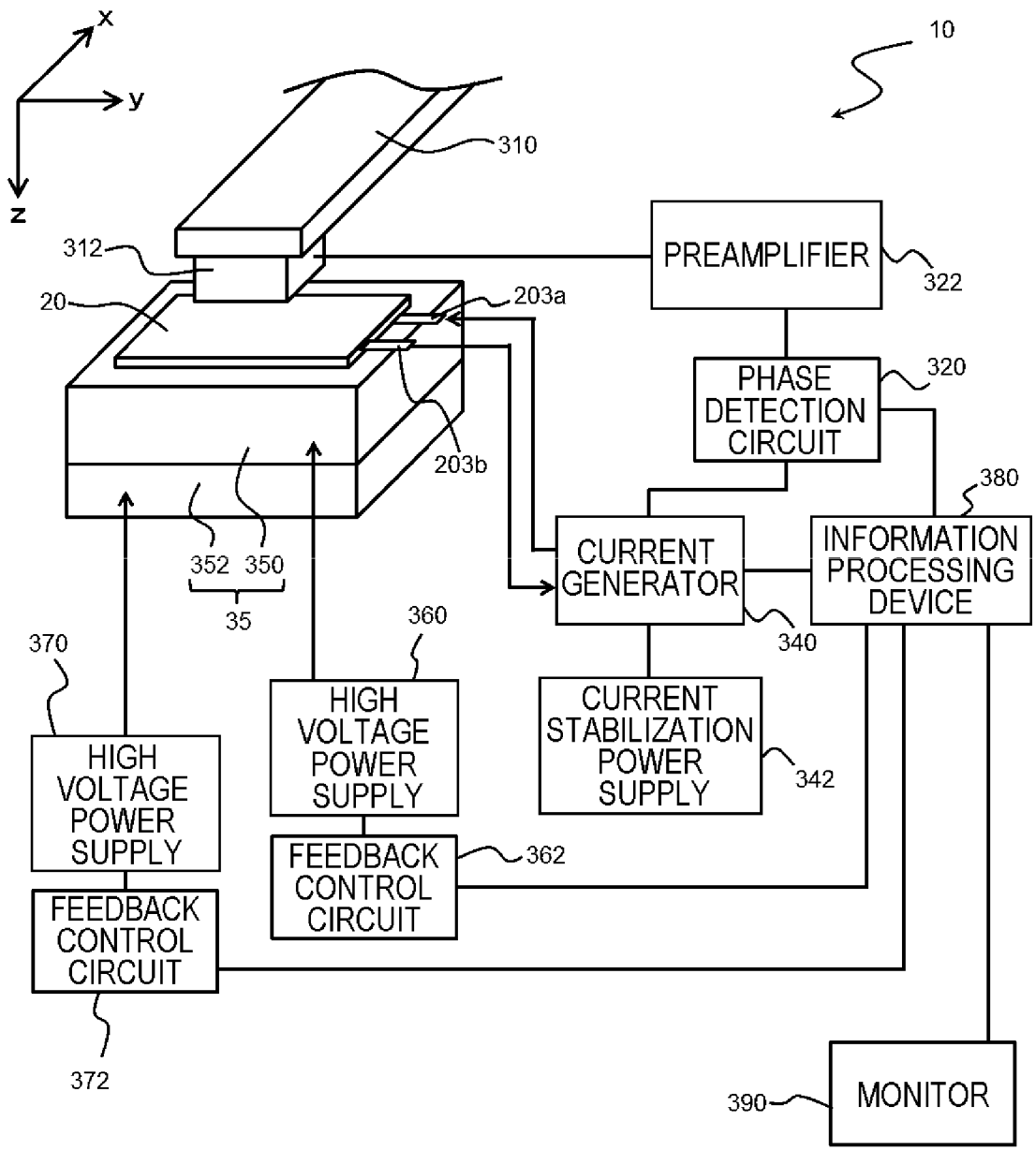
FIG. 3 is a diagram illustrating a configuration example of the measurement device according to the first embodiment.

FIG. 3 is a diagram illustrating a configuration example of the measurement device 10 according to the present embodiment. Each constitutional element of the measurement device 10 will be described with reference to FIGS. 1 to 3.

The current applying unit 120 applies a pulsed current (pulse current) or a current having a plurality of frequencies to a laminated body having a structure in which a plurality of layers having different electrical conductivities from each other are laminated. The current applying unit 120 is constituted with, for example, a current generator 340, a current stabilization power supply 342, and an information processing device 380. The information processing device 380 is, for example, a computer including a CPU, a memory, a program loaded into a memory, a storage medium such as a hard disk that stores the program, a network connection interface, and the like. The current stabilization power supply 342 supplies power to the current generator 340. The current generator 340 outputs a pulse current based on a control signal from the information processing device 380. Alternatively, the current generator 340 outputs an alternating current based on a control signal from the information processing device 380 and sweeps the frequency of the current. The current generator 340 is electrically connected to one of the layers constituting the laminated body 20. In the example of FIG. 3, the laminated body 20 has the structure illustrated in FIG. 2, the current generator 340 is connected to the first electrode 203a and the second electrode 203b of the laminated body 20, and a current flows between the first electrode 203a and the second electrode 203b. The structure of the laminated body 20 to be measured is not limited to the structure illustrated in FIG. 2. For example, it may be a sample in which all the first layers 210 are not electrically connected to each other. In that case, the current from the current applying unit 120 may be applied to at least one layer of the laminated body. The current generator 340 outputs a reference signal synchronized with the current applied to the laminated body 20.

The laminated body 20 is disposed on a sample stage 35. The sample stage 35 includes an XYZ drive stage 350 and a θ drive stage 352, and can change a relative position of the laminated body 20 with respect to a magnetic sensor 312 described later on the basis of a control signal from the information processing device 380. Specifically, a signal indicating the coordinates to be taken by each stage or a signal indicating a drive amount is output from the information processing device 380 to a feedback control circuit 362 and a feedback control circuit 372. Then, in the feedback control circuit 362 and the feedback control circuit 372, signals indicating the voltages to be applied to the XYZ drive stage 350 and the θ drive stage 352 are generated and output, respectively. Specifically, the feedback control circuit 362 and the feedback control circuit 372 perform feedback control based on outputs of position sensors provided in the XYZ drive stage 350 and the θ drive stage 352, respectively, to generate a signal so as to allow driving to a desired position or a desired amount of driving. A high voltage power supply 360 and a high voltage power supply 370 amplify the signals from the feedback control circuit 362 and the feedback control circuit 372, respectively, and input the amplified signals to the XYZ drive stage 350 and the θ drive stage 352, respectively. The XYZ drive stage 350 and the θ drive stage 352 are driven in accordance with input signals from the high voltage power supply 360 and the high voltage power supply 370, respectively.

In the measurement, the sample stage 35 is driven such that the magnetic sensor 312 scans in the xy-plane. The magnetic sensor 312 is attached to the sensor holding unit 310. A distance sensor such as an electrostatic capacitance sensor is attached to a sensor holding unit 310 and can measure the distance between the magnetic sensor 312 and the laminated body 20 or the distance between the magnetic sensor 312 and the sample stage 35. Then, based on the measured distance, z driving of the XYZ drive stage 350 is feedback controlled so that it is possible to scan over the laminated body 20 at a predetermined z-coordinate. By doing so, the magnetic sensor 312 can measure the magnetic field at each point in the xy-plane at the desired z-coordinate.

While the magnetic sensor 312 scans in the first plane 201 and the second plane 202, the current applying unit 120 applies pulses one by one at each lattice point represented by the xy-coordinates, for example. Alternatively, the current applying unit 120 sweeps the current frequency at each lattice point in a predetermined range.

The acquisition unit 140 acquires in-plane distribution information including at least information indicating the distribution of the magnetic field of the first plane 201 outside the laminated body 20. The acquisition unit 140 is constituted with, for example, a magnetic sensor 312, a preamplifier 322, a phase detection circuit 320, and the information processing device 380.

The magnetic sensor 312 is a magnetic sensor such as a tunnel magneto resistance (TMR) element. The magnetic field outside the laminated body 20 can be measured by the magnetic sensor 312. Specifically, the magnetic sensor 312 can measure the x-component, the y-component, the z-component of the magnetic field at a plurality of points in the first plane 201 and the second plane 202, and their time change. The acquisition unit 140 may acquire the in-plane distribution information from another measurement device.

Only one magnetic sensor is attached to the magnetic sensor 312, and the magnetic field at one x-coordinate may be measured every time one line scanning is performed, or a plurality of magnetic sensors may be disposed in an array and magnetic field information of a plurality of x-coordinates may be acquired by performing one line scanning. The x-component, the y-component, and the z-component of the magnetic field may be measured simultaneously by a single scan, or may be measured by scanning twice or three times by changing the component to be measured.

The in-plane distribution information includes magnetic field information on a magnetic field at least for each of a plurality of points in the first plane 201. Here, the magnetic field information includes information indicating a response characteristic of the x-component, the y-component, and the z-component of the magnetic field. As described above, the response characteristic is the response characteristic of the magnetic field with respect to the change in the current applied by the current applying unit 120. That is, the magnetic field information can be represented by a complex magnetic field vector.

Here, FIG. 3 illustrates an example of a case where the current applying unit 120 applies the current having a plurality of frequencies to the laminated body 20, that is, a case where the frequency of the current is swept. An output signal from the magnetic sensor 312 is input to the preamplifier 322 and amplified, and then input to the phase detection circuit 320 as a measurement signal. Based on the signal input from the preamplifier 322 and the reference signal from the current generator 340, the phase detection circuit 320 associates time change of the measured magnetic field with time change of the current applied to the laminated body 20. Specifically, the phase detection circuit 320 outputs a signal indicating an amplitude of the input measurement signal and a signal indicating a phase difference between the measurement signal and the reference signal for each component of the x, y, and z-components. In the information processing device 380, magnetic field information at each xy-coordinate represented by a complex magnetic field vector is obtained on the basis of signals indicating the amplitude and phase difference. In this way, the acquisition unit 140 acquires the in-plane distribution information.

On the other hand, in a case where the current applying unit 120 applies the pulse current to the laminated body 20, the phase detection circuit 320 can be omitted. In this case, the measurement signal output from the preamplifier 322 and the reference signal from the current generator 340 are input to the information processing device 380. Then, the information processing device 380 generates information indicating a pulse response in association with the measured magnetic field so that the rising time point of the applied pulse current is set to t=0. In the information processing device 380, information indicating the pulse response is subjected to inverse Fourier transform, thereby obtaining magnetic field information at each xy-coordinate represented by a complex magnetic field vector. In this way, the acquisition unit 140 acquires the in-plane distribution information.

The magnetic field information input to the information processing device 380 is subjected to further processing such as resolution enhancement, and the processing unit 160 may generate the three-dimensional magnetic field distribution information on the outside of the laminated body 20 by using the in-plane distribution information after processing as described later.

The processing unit 160 generates three-dimensional magnetic field distribution information indicating the three-dimensional distribution of magnetic field on the outside of the laminated body 20, based on the in-plane distribution information. The processing unit 160 is constituted by the information processing device 380.

Figure 4:
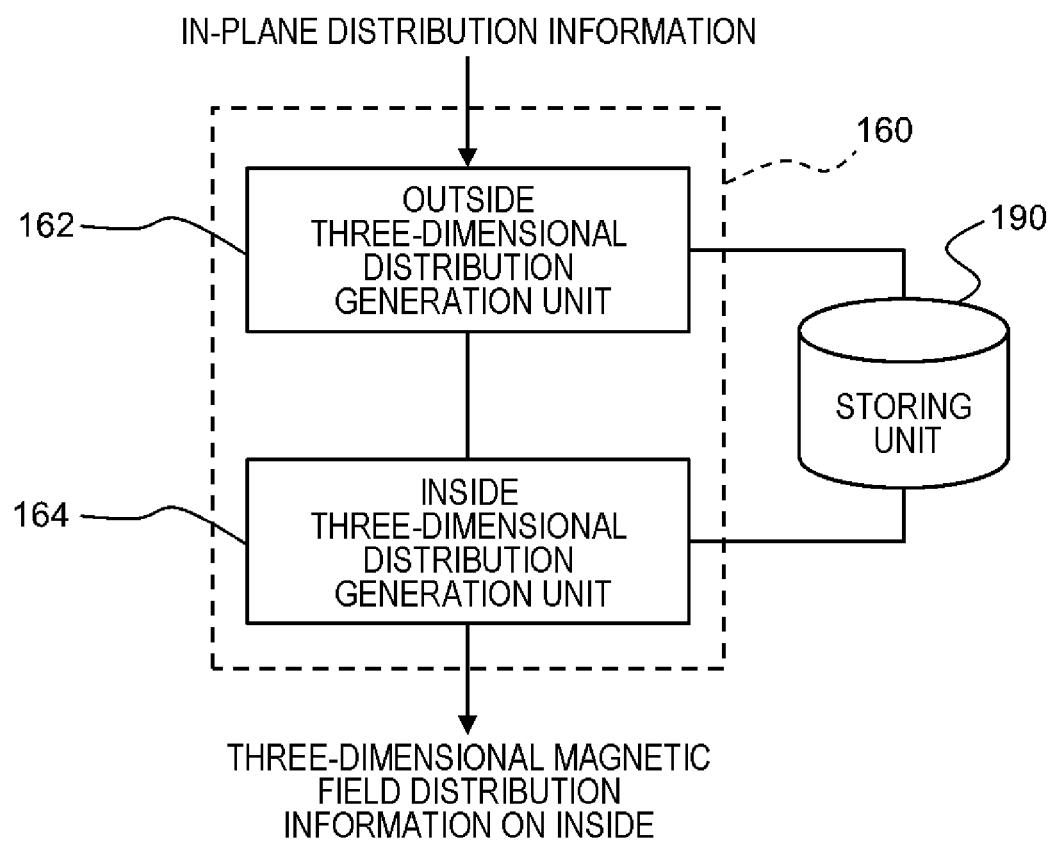
FIG. 4 is a block diagram illustrating a functional configuration of a processing unit according to the first embodiment.

FIG. 4 is a block diagram illustrating a functional configuration of the processing unit 160 according to the first embodiment. In the present embodiment, the processing unit 160 includes the outside three-dimensional distribution generation unit 162 and the inside three-dimensional distribution generation unit 164. The outside three-dimensional distribution generation unit 162 processes the in-plane distribution information acquired by the acquisition unit 140 to generate three-dimensional magnetic field distribution information on the outside of the laminated body 20. The inside three-dimensional distribution generation unit 164 processes the three-dimensional magnetic field distribution information on the outside of the laminated body 20 generated by the outside three-dimensional distribution generation unit 162 to generate three-dimensional magnetic field distribution information on the inside of the laminated body 20 as information on the inside of the laminated body 20.

First, processing contents of the outside three-dimensional distribution generation unit 162 will be described below. The three-dimensional magnetic field distribution information on the outside of the laminated body 20 is represented by the following expression (1), and s is represented by the following expression (2). Here, $k_x$ is a wave number in the x-direction of the magnetic field, $k_y$ is the wave number in the y-direction of the magnetic field, z is a z-coordinate, $\omega$ is a frequency, $\sigma$ is electrical conductivity, $\mu$ is magnetic permeability, and the following expression (3) is a complex magnetic field vector. In the present embodiment, an outer space of the laminated body 20 is air, $\sigma$ is the electrical conductivity of air, and $\mu$ is the magnetic permeability of air. Then, the outside three-dimensional distribution generation unit 162 obtains vectors $a(k_x, k_y, \omega)$ and $b(k_x, k_y, \omega)$ in the equation (1) using information indicating the distribution of the magnetic field of the first plane 201 and the information indicating the distribution of the magnetic field of the second plane 202. Each mathematical expression will be described later in detail.

$$\tilde{H}(k_x, k_y, z, \omega) = a(k_x, k_y, \omega)e^{sz} + b(k_x, k_y, \omega)e^{-sz} \tag{1}$$

$$s = \frac{\sqrt{k_x^2 + k_y^2 + \sqrt{(k_x^2+k_y^2)^2 + \omega^2\sigma^2\mu^2}}}{\sqrt{2}} + i\frac{\sqrt{-k_x^2 - k_y^2 + \sqrt{(k_x^2+k_y^2)^2 + \omega^2\sigma^2\mu^2}}}{\sqrt{2}} \tag{2}$$

$$\tilde{H}(k_x, k_y, z, \omega) \tag{3}$$

That is, the outside three-dimensional distribution generation unit 162 can process as follows. First, the outside three-dimensional distribution generation unit 162 acquires in-plane distribution information. Here, the in-plane distribution information includes information indicating the complex magnetic field vector at each coordinate as described above. It is assumed that the z-coordinate of the first plane 201 is $z_1$, the z-coordinate of the second plane 202 is $z_2$, information indicating the distribution of the magnetic field of the first plane 201 is, $$H_1(x,y,z_1,\omega) \tag{4}$$

and information indicating the distribution of the magnetic field of the second plane 202 is $$H_2(x,y,z_2,\omega) \tag{5}$$

Then, the outside three-dimensional distribution generation unit 162 obtains $$\tilde{H}_1(k_x,k_y,z_1,\omega) \tag{6}$$

by performing Fourier transformation on the information indicating the distribution of the magnetic field of the first plane 201 with respect to x and y, and obtains $$\tilde{H}_2(k_x,k_y,z_2,\omega) \tag{7}$$

by performing Fourier transformed on information indicating the distribution of the magnetic field of the second plane 202 with respect to x and y.

Then, a three-dimensional distribution of the complex magnetic field vector represented by the expression (1) is generated as the three-dimensional magnetic field distribution information on the outside of the laminated body 20. Here, a and b in the expression (1) are vectors which satisfy the following expressions (8) and (9).

$$\tilde{H}_1(k_x,k_y,z_1,\omega)=a(k_x,k_y,\omega)e^{sz_1}+b(k_x,k_y,\omega)e^{-sz_1} \tag{8}$$

$$\tilde{H}_2(k_x,k_y,z_2,\omega)=a(k_x,k_y,\omega)e^{sz_2}+b(k_x,k_y,\omega)e^{-sz_2} \tag{9}$$

In this manner, the three-dimensional magnetic field distribution information on the outside of the laminated body 20 is generated from the in-plane distribution information including information indicating the response characteristic to the change in the current applied by the current applying unit 120. The three-dimensional magnetic field distribution information on the outside of the laminated body 20 includes the frequency characteristic of the magnetic field. The three-dimensional magnetic field distribution information on the outside of the laminated body 20 is data represented by, for example, a mathematical expression or a table.

Next, the inside three-dimensional distribution generation unit 164 of the processing unit 160 generates information on the inside of the laminated body 20 by processing the three-dimensional magnetic field distribution information on the outside of the laminated body 20. In the present embodiment, the processing unit 160 generates the three-dimensional magnetic field distribution information on the inside of the laminated body 20 based on the three-dimensional magnetic field distribution information on the outside of the laminated body 20. Processing performed by the inside three-dimensional distribution generation unit 164 will be described below.

The inside three-dimensional distribution generation unit 164 acquires the three-dimensional magnetic field distribution information on the outside of the laminated body 20 from the outside three-dimensional distribution generation unit 162. Then, the inside three-dimensional distribution generation unit 164 generates the three-dimensional magnetic field distribution information on the inside of the laminated body 20 based on the three-dimensional magnetic field distribution information on the outside of the laminated body 20, the boundary condition between the magnetic fields inside and outside the laminated body 20, and a plurality of relational expressions to be satisfied by the magnetic field inside the laminated body 20.

Specifically, the boundary condition between the magnetic fields inside and outside the laminated body 20 is represented by the expression (10).

$$\tilde{H}_x|_{inside} = \tilde{H}_x|_{outside} \quad (10)$$

$$\tilde{H}_y|_{inside} = \tilde{H}_y|_{outside}$$

$$\tilde{H}_z|_{inside} = \tilde{H}_z|_{outside}$$

$$\sigma_a^{-1}\left(-ik_y\tilde{H}_z - \frac{\partial \tilde{H}_y}{\partial z}\right)\bigg|_{outside} = \sigma_c^{-1}\left(-ik_y\tilde{H}_z - \frac{\partial \tilde{H}_y}{\partial z}\right)\bigg|_{inside}$$

$$\sigma_a^{-1}\left(-ik_x\tilde{H}_z - \frac{\partial \tilde{H}_x}{\partial z}\right)\bigg|_{outside} = \sigma_c^{-1}\left(-ik_x\tilde{H}_z - \frac{\partial \tilde{H}_x}{\partial z}\right)\bigg|_{inside}$$

$$\frac{\partial \tilde{H}_z}{\partial z}\bigg|_{outside} = \frac{\partial \tilde{H}_z}{\partial z}\bigg|_{inside}$$

Here, $\tilde{H}_x$ is the x-component of the complex magnetic field vector, $\tilde{H}_y$ is the y-component of the complex magnetic field vector, $\tilde{H}_z$ is the z-component of the complex magnetic field vector, $\sigma_a$ is the electrical conductivity of outside the laminated body 20, and $\sigma_c$ is the electrical conductivity of the first layer 210. Here, the first layer 210 is the outermost layer on the first plane 201 side of the laminated body 20.

Specifically, a plurality of relational expressions to be satisfied by the magnetic field inside the laminated body 20 is expressed by the equation (11). Here, µ is magnetic permeability, t is time, $H_x$ is a component in the x-direction of the magnetic field, $H_y$ is a component in the y-direction of the magnetic field, $H_z$ is a component in the z-direction of the magnetic field, $g_c$ is a thickness of the first layer 210, $g_e$ is a thickness of the second layer 220, $\sigma_c$ is the electrical conductivity of the first layer 210, and $\sigma_e$ is the electrical conductivity of the second layer 220. Each mathematical expression will be described later in detail.

$$\mu\frac{\partial}{\partial t}H_x = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_x + \quad (11)$$

$$\frac{g_e g_c(\sigma_c - \sigma_e)^2}{(g_c\sigma_c + g_e\sigma_e)(g_e + g_c)\sigma_c\sigma_e}\frac{\partial^2}{\partial x \partial z}H_z$$

$$\mu\frac{\partial}{\partial t}H_y = \left\{\frac{(g_e\sigma_c + g_c\sigma_e)}{(g_e + g_c)\sigma_c\sigma_e}\left(\frac{\partial^2}{\partial x^2} + \frac{\partial}{\partial y^2}\right) + \frac{(g_c + g_e)}{(g_c\sigma_c + g_e\sigma_e)}\frac{\partial^2}{\partial z^2}\right\}H_y +$$

$$\frac{g_e g_c(\sigma_c - \sigma_e)^2}{(g_c\sigma_c + g_e\sigma_e)(g_e + g_c)\sigma_c\sigma_e}\frac{\partial}{\partial y \partial z}H_z$$

$$\mu\frac{\partial}{\partial t}H_z = \frac{(g_e + g_c)}{(g_e\sigma_e + g_c\sigma_c)}\left(\frac{\partial^2}{\partial x^2} + \frac{\partial^2}{\partial y^2} + \frac{\partial^2}{\partial z^2}\right)H_z$$

In the boundary condition, the magnetic field outside the laminated body 20 and its differential are derived from the expression (1) described above. As a solution to the expression (11), three-dimensional magnetic field distribution information on the inside of the laminated body 20 is obtained. The three-dimensional magnetic field distribution information on the inside of the laminated body 20 is represented by H(x, y, z). Here, H(x, y, z) includes information indicating the x-component, the y-component, and the z-component of the magnetic field of each coordinate. The three-dimensional magnetic field distribution information on the inside of the laminated body 20 is data represented by, for example, a mathematical expression or a table. The three-dimensional magnetic field distribution information on the inside of the laminated body 20 may not include the frequency characteristic.

The three-dimensional magnetic field distribution information on the inside of the laminated body 20 output from the inside three-dimensional distribution generation unit 164 is input to the display unit 180, for example. The display unit 180 is constituted with, for example, the information processing device 380 and a monitor 390. In the display unit 180, data for displaying an image of the three-dimensional magnetic field distribution information on the inside of the laminated body 20 is generated. Then, the distribution of the magnetic field inside the laminated body 20 can be displayed as an image on the monitor 390.

In the following, a measurement method according to the present embodiment will be described. This measurement method is realized by the measurement device 10 as described above.

In the measurement method according to the present embodiment, a pulse current or a current having a plurality of frequencies is applied to the laminated body 20 having a structure in which a plurality of layers having different electrical conductivities from each other are laminated and in-plane distribution information including at least information indicating the distribution of the magnetic field of the first plane 201 outside the laminated body 20 is acquired. Then, based on the in-plane distribution information, three-dimensional magnetic field distribution information indicating the three-dimensional distribution of magnetic field on the outside of the laminated body 20 is generated. Furthermore, information on the inside of the laminated body 20 is generated by processing the three-dimensional magnetic field distribution information on the outside of the laminated body 20. Here, the in-plane distribution information includes information indicating the response characteristic to a change in current applied to the laminated body 20 and the three-dimensional magnetic field distribution information on the outside of the laminated body 20 includes the frequency characteristic of the magnetic field. In the following, description will be made in detail.

First, while the current applying unit 120 applies a pulse current or a current having a plurality of frequencies to the laminated body 20, the acquisition unit 140 acquires the in-plane distribution information including at least information indicating the distribution of the magnetic field of the first plane 201 outside the laminated body 20. Specifically, information indicating the response characteristic of the magnetic field with respect to the change in current is obtained by scanning the measurement positions of the magnetic field with respect to the laminated body 20 and applying a pulse current at each measurement point or by sweeping the frequency of the current at each measurement point. In the present embodiment, measurement is similarly performed on the second plane 202 to acquire the in-plane distribution information.

As described above, the processing unit 160 processes the in-plane distribution information including the information indicating the distribution of the magnetic field of the first plane 201 and the information indicating the distribution of the magnetic field of the second plane 202 to thereby generate the three-dimensional magnetic field distribution information on the outside of the laminated body 20. Furthermore, the processing unit 160 processes the three-dimensional magnetic field distribution information on the outside of the laminated body 20 to thereby generate the three-dimensional magnetic field distribution information on the inside of the laminated body 20 as information on the inside of the laminated body 20.

The measurement device 10 may be a measurement device unit that can be attached to an existing device.

Next, operations and effects of the present embodiment will be described. According to the measurement device 10 of the present embodiment, it is possible to obtain information on the inside of the laminated body 20 such as a battery. Furthermore, it provides useful information for non-destructive failure analysis and the like.

In the present embodiment, it is possible to know the three-dimensional magnetic field distribution inside the laminated body 20 such as a battery. Therefore, it is possible to specifically know the situation inside the laminated body 20.

In the following, description will be made on analysis of the magnetic field inside and outside the laminated body 20. In the following description, the laminated body 20 is described as a battery, but the laminated body 20 is not limited to the battery.

<I Overview>

It is difficult to inspect inside of a battery having a multilayer structure using a magnetic field with a method in which a DC magnetic field is used. It is necessary to measure a new physical quantity in order to obtain information in the z-direction which is the direction perpendicular to a battery surface. The frequency characteristic is considered as the new physical quantity. Since the inside of the battery is a conductor, an internal magnetic field satisfies a diffusion type partial differential equation. Accordingly, information obtained is considerably restricted as compared with the case where the wave equation is satisfied.

In the following, electrodes and electrolytes inside the battery are averaged and made continuous, and a diffusion equation is derived. Next, the boundary condition on the battery surface of this equation is derived. The boundary condition is obtained by measuring the frequency dependent complex data of the magnetic field at a place away from the surface. For the diffusion equation which is made continuous, an inverse problem can be analyzed by using the boundary condition. By setting time t=0, a final solution to the inverse problem can be obtained. These processes are similar to inverse analysis using the Laplace's equation in the case of the conventional static magnetic field, which are extension to a natural time dependent system. As a result, a three-dimensional image can be obtained.

In the following "II Assumption of 2D magnetic field ($B_x$, $B_y$, 0)", it is assumed that the magnetic field is two dimensional (x, y plane). In the following "III Basic Theory Assumption of 3D magnetic field ($B_x$, $B_y$, $B_z$)", the same result as in the case of two dimensions is obtained assuming that the magnetic field is three-dimensional. This corresponds to a case where the z-component of the magnetic field included in the in-plane distribution information described in the first embodiment is measured and used for processing.

<II Assumption of 2D Magnetic Field ($B_x$, $B_y$, 0)>

<II-1 Averaged Basic Equation>

Figure 6:
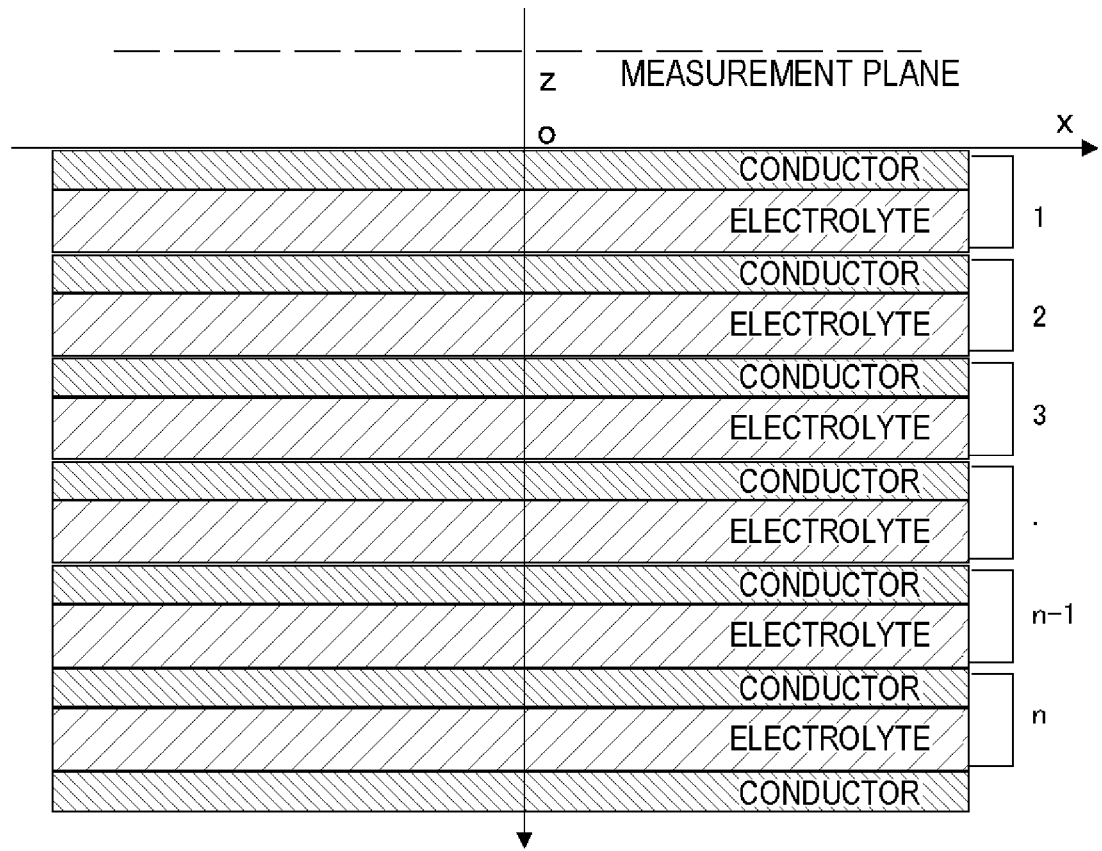
FIG. 6 is a view illustrating a structure of a battery having a multilayer structure.

A practical battery has a multilayer structure. Since the existing magnetic imaging technology is a two-dimensional (x-y plane) imaging technology, it was difficult to find out which layer of the multilayer there is an abnormal portion. Image reconstruction has been performed using measured data with DC or at a fixed frequency. FIG. 6 is a view illustrating a structure of a battery having a multilayer structure. In the figure, n represents the number of pairs from the surface of the laminated body when the conductor layer and the electrolyte layer are regarded as one pair. In this description, it is aimed at three-dimensional imaging of a battery having a multilayer structure as illustrated in FIG. 6. Magnetic field data at multiple frequencies or impulse response data of the magnetic field is used.

In the following, a quasi-stationary electromagnetic field equation inside the multilayer structure is derived. It is assumed that the electrical conductivity is constant inside each layer. Furthermore, it is assumed that the electrical conductivities of the plurality of electrolytes are equal to each other, the electrical conductivities of the plurality of conductors are equal to each other, and the electrical conductivity of the electrolyte and the electrical conductivity of the conductors are $\sigma_e$ and $\sigma_c$, respectively. The equation about the inside of each layer is represented by Maxwell's equation as follows.

$$\nabla \times E = -\partial_t B$$

$$\nabla \times H = j = \sigma E \qquad (1\text{-}1)$$

Next consideration will be given on the boundary condition between two layers. Since consideration is given on the case of a quasi-stationary electromagnetic field in which the electrical conductivity of a conductor is considered to be finite, it is not necessary to consider that the current is concentrated on the boundary surface. Accordingly, the following expression is established.

1. $H_t$ is continuous at boundary surface

2. $E_t$ is continuous at boundary surface (1-2)

Figure 7:
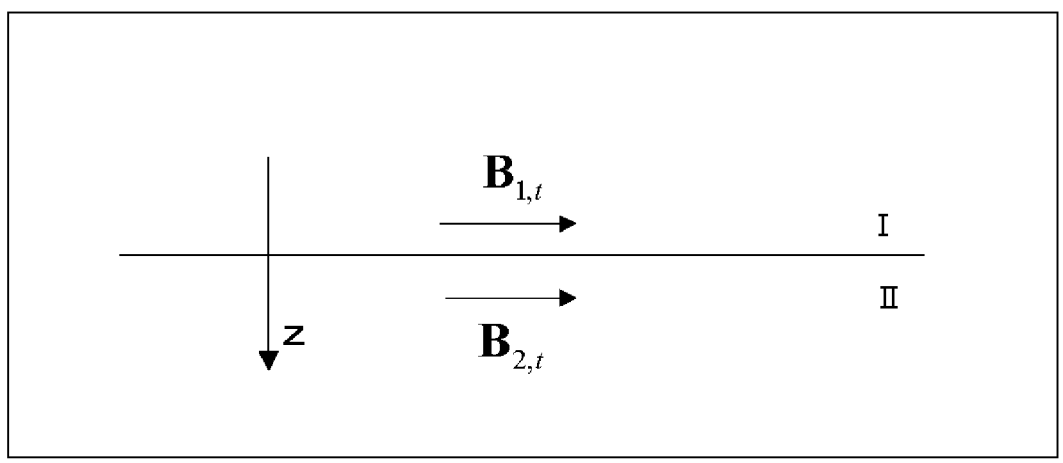
FIG. 7 is a view illustrating a boundary between a layer and a layer.

Here, FIG. 7 illustrates the boundary between layers. t represents a component in the tangential direction as illustrated in FIG. 7. When the component in the normal direction of the magnetic field is assumed as 0 from the assumption of 2D and the expression (1-2) is rewritten using the expression (1-1), the expression (1-2) becomes as follows.

1. $B_{1,t} = B_{2,t}$

2. $\partial_z B_{1,t}/\sigma_1 = \partial_z B_{2,t}/\sigma_2$ (1-3)

Here, the value of magnetic permeability μ is equal for air, aluminum, and copper. From the expression (1-1), if an equation of H only inside each layer is derived, it becomes $$\Delta H = \sigma \mu \frac{\partial}{\partial t} H. \tag{1-4}$$

When this is subjected to Fourier transformation, the following expression is obtained.

$$Q(k_x, k_y, z, \omega) = \int_{-\infty}^{\infty} \int_{-\infty}^{\infty} \int_{-\infty}^{\infty} e^{-i\omega t + ik_x x + ik_y y} H(x, y, z, t) dx dy dt \tag{1-5}$$

$$\left(\frac{d^2}{dz^2} - k_x^2 - k_y^2 - i\omega\sigma\mu\right) Q(k_x, k_y, z, \omega) = 0 \tag{1-6}$$

The general solution of this equation is as follows.

$$Q(k_x, k_y, z, \omega) = c_1(k_x, k_y, \omega) e^{sz} + c_2(k_x, k_y, \omega) e^{-sz} \tag{1-7}$$

Here, s is as follows.

$$s^2 = k_x^2 + k_y^2 + i\omega\sigma\mu \tag{1-8}$$

$$s = \frac{\sqrt{k_x^2 + k_y^2 + \sqrt{(k_x^2 + k_y^2)^2 + \omega^2\sigma^2\mu^2}}}{\sqrt{2}} + i\frac{\sqrt{-k_x^2 - k_y^2 + \sqrt{(k_x^2 + k_y^2)^2 + \omega^2\sigma^2\mu^2}}}{\sqrt{2}}$$

With z=0 and z=z in one layer, the following expression is established. Representation with parameters omitted is used.

$$\begin{pmatrix} Q_0 \\ \dot{Q}_0 \end{pmatrix} = \begin{pmatrix} 1 & 1 \\ s & -s \end{pmatrix} \begin{pmatrix} c_1 \\ c_2 \end{pmatrix} \tag{1-9}$$

$$\begin{pmatrix} Q_z \\ \dot{Q}_z \end{pmatrix} = \begin{pmatrix} e^{sz} & e^{-sz} \\ se^{sz} & -se^{-sz} \end{pmatrix} \begin{pmatrix} c_1 \\ c_2 \end{pmatrix}$$

Here, a dot symbol $$\dot{Q}$$

represents differential of Q with respect to z. When $(c_1, c_2)$ is deleted from this expression, the following expression is obtained.

$$\begin{pmatrix} Q_z \\ \dot{Q}_z \end{pmatrix} = \begin{pmatrix} e^{sz} & e^{-sz} \\ se^{sz} & -se^{-sz} \end{pmatrix} \begin{pmatrix} 1/2 & 1/(2s) \\ 1/2 & -1/(2s) \end{pmatrix} \begin{pmatrix} Q_0 \\ \dot{Q}_0 \end{pmatrix} = \begin{pmatrix} \cosh(sz) & \sinh(sz)/s \\ s \cdot \sinh(sz) & \cosh(sz) \end{pmatrix} \begin{pmatrix} Q_0 \\ \dot{Q}_0 \end{pmatrix} \tag{1-10}$$

Figure 8:
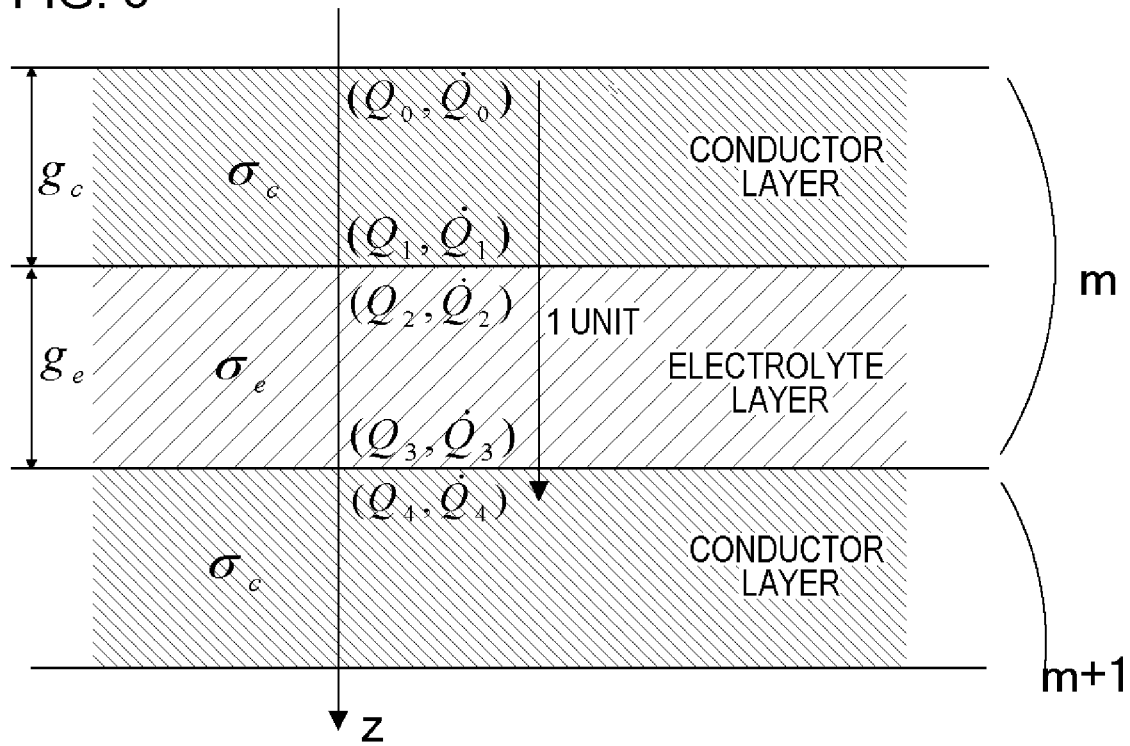
FIG. 8 is a diagram illustrating definitions of variables in the laminated body.

This expression is applied to the case where the conductor layer and the electrolyte layer are paired as illustrated in FIG. 8. FIG. 8 is a view illustrating definitions of variables in the laminated body. In this figure, m indicates the number of pairs from the surface of the laminated body.

$$\begin{pmatrix} Q_4 \\ \dot{Q}_4 \end{pmatrix} = \begin{pmatrix} 1 & 0 \\ 0 & \frac{\sigma_c}{\sigma_e} \end{pmatrix} \begin{pmatrix} Q_3 \\ \dot{Q}_3 \end{pmatrix} \tag{1-11}$$

$$\begin{pmatrix} Q_3 \\ \dot{Q}_3 \end{pmatrix} = \begin{pmatrix} \cosh(s_e g_e) & \sinh(s_e g_e)/s_e \\ s_e \cdot \sinh(s_e g_e) & \cosh(s_e g_e) \end{pmatrix} \begin{pmatrix} Q_2 \\ \dot{Q}_2 \end{pmatrix}$$

$$\begin{pmatrix} Q_2 \\ \dot{Q}_2 \end{pmatrix} = \begin{pmatrix} 1 & 0 \\ 0 & \frac{\sigma_e}{\sigma_c} \end{pmatrix} \begin{pmatrix} Q_1 \\ \dot{Q}_1 \end{pmatrix}$$

$$\begin{pmatrix} Q_1 \\ \dot{Q}_1 \end{pmatrix} = \begin{pmatrix} \cosh(s_c g_c) & \sinh(s_c g_c)/s_c \\ s_c \cdot \sinh(s_c g_c) & \cosh(s_c g_c) \end{pmatrix} \begin{pmatrix} Q_0 \\ \dot{Q}_0 \end{pmatrix}$$

Here, it is assumed that each layer is thin. Specifically, it is assumed that the following expression is established.

$$s_e g_e \approx \frac{k_x g_e}{\sqrt{2}} \ll 1, \; s_c g_c \approx \frac{k_x g_c}{\sqrt{2}} \ll 1 \tag{1-12}$$

Here, it is $$k_x \approx k_y.$$

Leave only the first-order terms of $g_c$ and $g_e$ in the inside of the matrix.

$$\begin{pmatrix} Q_4 \\ \dot{Q}_4 \end{pmatrix} = \begin{pmatrix} 1 & 0 \\ 0 & \frac{\sigma_c}{\sigma_e} \end{pmatrix} \begin{pmatrix} Q_3 \\ \dot{Q}_3 \end{pmatrix} \tag{1-13}$$

$$\begin{pmatrix} Q_3 \\ \dot{Q}_3 \end{pmatrix} = \begin{pmatrix} 1 & g_e \\ s_e^2 g_e & 1 \end{pmatrix} \begin{pmatrix} Q_2 \\ \dot{Q}_2 \end{pmatrix}$$

$$\begin{pmatrix} Q_2 \\ \dot{Q}_2 \end{pmatrix} = \begin{pmatrix} 1 & 0 \\ 0 & \frac{\sigma_e}{\sigma_c} \end{pmatrix} \begin{pmatrix} Q_1 \\ \dot{Q}_1 \end{pmatrix}$$

$$\begin{pmatrix} Q_1 \\ \dot{Q}_1 \end{pmatrix} = \begin{pmatrix} 1 & g_c \\ s_c^2 g_c & 1 \end{pmatrix} \begin{pmatrix} Q_0 \\ \dot{Q}_0 \end{pmatrix}$$

If the expression (1-13) is cleaned up, it becomes as follows. Terms within { } are second-order minute amounts and are ignored.

$$\begin{pmatrix} Q_4 \\ \dot{Q}_4 \end{pmatrix} = \begin{pmatrix} 1 + \left\{\frac{\sigma_e g_e g_c s_c^2}{\sigma_c}\right\} & \frac{\sigma_c g_c + \sigma_e g_e}{\sigma_c} \\ \frac{\sigma_c s_e^2 g_e + \sigma_e s_c^2 g_c}{\sigma_e} & 1 + \left\{\frac{\sigma_c g_c g_e s_e^2}{\sigma_e}\right\} \end{pmatrix} \begin{pmatrix} Q_0 \\ \dot{Q}_0 \end{pmatrix} \quad (1\text{-}14)$$

The length $\Delta z$ of one unit is given by the following expression.

$$\Delta z = g_c + g_e \quad (1\text{-}15)$$

Under the preparation described above, a macro (averaged) equation relating to the horizontal component of the magnetic field is derived. The following expression is established at an extreme limit where $\Delta z$ is small. Here, $$\partial/\partial z$$

represents the differential of the macro.

$$\frac{\partial}{\partial z}\begin{pmatrix} Q_4 \\ \dot{Q}_4 \end{pmatrix} = \lim_{\Delta z \to 0} \frac{1}{\Delta z}\left[\begin{pmatrix} Q_4 \\ \dot{Q}_4 \end{pmatrix} - \begin{pmatrix} Q_0 \\ \dot{Q}_0 \end{pmatrix}\right] = \quad (1\text{-}16)$$

$$\lim_{\Delta z \to 0} \frac{1}{\Delta z}\begin{pmatrix} 0 & \frac{\sigma_c g_c + \sigma_e g_e}{\sigma_c} \\ \frac{\sigma_c s_e^2 g_e + \sigma_e s_c^2 g_c}{\sigma_e} & 0 \end{pmatrix}\begin{pmatrix} Q_0 \\ \dot{Q}_0 \end{pmatrix} =$$

$$\begin{pmatrix} 0 & \frac{\sigma_c g_c + \sigma_e g_e}{\sigma_c(g_c + g_e)} \\ \frac{\sigma_c s_e^2 g_e + \sigma_e s_c^2 g_c}{\sigma_e(g_c + g_e)} & 0 \end{pmatrix}\begin{pmatrix} Q_0 \\ \dot{Q}_0 \end{pmatrix}$$

It can be written like the following expression.

$$\frac{\partial}{\partial z}Q_4 = \frac{\sigma_c g_c + \sigma_e g_e}{\sigma_c(g_c + g_e)}\dot{Q}_0 \quad (1\text{-}17)$$

$$\frac{\partial}{\partial z}\dot{Q}_4 = \frac{\sigma_c s_e^2 g_e + \sigma_e s_c^2 g_c}{\sigma_e(g_c + g_e)}Q_0$$

Here, when it is $$Q_4 = Q_0 = \varphi, \dot{Q}_4 = \dot{Q}_0 = \phi$$

the expression (1-17) becomes as follows.

$$\frac{\partial}{\partial z}\varphi = \frac{\sigma_c g_c + \sigma_e g_e}{\sigma_c(g_c + g_e)}\phi \quad (1\text{-}18)$$

$$\frac{\partial}{\partial x}\phi = \frac{\sigma_c s_e^2 g_e + \sigma_e s_c^2 g_c}{\sigma_e(g_c + g_e)}\varphi$$

When $$\phi$$

is deleted, the following expression is obtained.

$$\frac{\partial^2}{\partial z^2}\varphi = \frac{\sigma_c g_c + \sigma_e g_e}{\sigma_c(g_c + g_e)}\frac{\sigma_c s_e^2 g_e + \sigma_e s_c^2 g_c}{\sigma_e(g_c + g_e)}\varphi \quad (1\text{-}19)$$

When the expression (1-8) is substituted into $S_e$ and $S_c$, the following expression is obtained.

$$\frac{\partial^2}{\partial z^2}\varphi = \quad (1\text{-}20)$$

$$\frac{(\sigma_c g_e + \sigma_e g_c)(\sigma_c g_c + \sigma_e g_e)}{\sigma_c \sigma_e(g_c + g_e)^2}(k_x^2 + k_y^2)\varphi + i\omega\mu\frac{(\sigma_c g_c + \sigma_e g_e)}{(g_c + g_e)}\varphi$$

Three-dimensional diffusion equations are obtained by inverse Fourier transformation.

$$\mu\frac{\partial}{\partial t}\Phi = \left\{\frac{(\sigma_c g_e + \sigma_e g_c)}{\sigma_c \sigma_e(g_c + g_e)}\left(\frac{\partial^2}{\partial x^2} + \frac{\partial^2}{\partial y^2}\right) + \frac{g_c + g_e}{\sigma_c g_c + \sigma_e g_e}\frac{\partial^2}{\partial z^2}\right\}\Phi \quad (1\text{-}21)$$

$\Phi$ is an inverse Fourier transformation of $\varphi$.

<II-2 Boundary Condition Between Air and Battery>

Two sets of boundary conditions are required for each vector element to connect air and metal electrodes of the battery. For that purpose, the integral type of Maxwell's equation is used.

$$\iint_D \nabla \times E dxdy = \oint_{\partial D} E \cdot ds = -\partial_t \iint_D Bdxdy \quad (2\text{-}1)$$

$$\iint_D \nabla \times H dxdy = \oint_{\partial D} H \cdot ds = \iint_D \sigma E dxdy$$

D is two-dimensional area, $\partial D$ is a counterclockwise boundary

If a rectangular area that is thin in the z-direction as the area D is defined with the boundary surface interposed therebetween and double integrals are made to approach 0 first, a condition that the tangential components $E_t$ and $H_t$ are continuous at the boundary surface is obtained. The electric field is not intended to be included in the boundary condition of the equation represented only by the magnetic field. However, in a case where the electrical conductivity is 0, it is $$\nabla \times H = j = \sigma E \quad (2\text{-}2)$$

from the second expression of the expression (1-1), and it is impossible to obtain the condition relating to the differential of H. Accordingly, air is virtually considered as a substance having a small but finite electrical conductivity, not a medium with electrical conductivity of 0 and its electrical conductivity is assumed to be $\sigma_a$. By doing this, the boundary condition that $E_t$ is continuous is represented as follows.

$$\left.\frac{\nabla \times H}{\sigma_a}\right|_{t\ air} = \left.\frac{\nabla \times H}{\sigma_c}\right|_{t\ \substack{battery \\ electrode}} \quad (2\text{-}3)$$

This expression can be rewritten as follows.

$$\sigma_a^{-1}\left(\frac{\partial H_z}{\partial y} - \frac{\partial H_y}{\partial z}\right)\bigg|_{air} = \sigma_c^{-1}\left(\frac{\partial H_z}{\partial y} - \frac{\partial H_y}{\partial z}\right)\bigg|_{\substack{battery \\ electrode}} \quad (2\text{-}4)$$

-continued $$\sigma_a^{-1}\left(\frac{\partial H_z}{\partial x} - \frac{\partial H_x}{\partial z}\right)\bigg|_{air} = \sigma_c^{-1}\left(\frac{\partial H_z}{\partial x} - \frac{\partial H_x}{\partial z}\right)\bigg|_{\substack{battery\\electrode}}$$

From the assumption of the 2D magnetic field, $$\sigma_a^{-1}\frac{\partial H_y}{\partial z}\bigg|_{air} = \sigma_c^{-1}\frac{\partial H_y}{\partial z}\bigg|_{\substack{battery\\electrode}} \quad (2\text{-}5)$$

$$\sigma_a^{-1}\frac{\partial H_x}{\partial z}\bigg|_{air} = \sigma_c^{-1}\frac{\partial H_x}{\partial z}\bigg|_{\substack{battery\\electrode}}$$

is obtained. The magnetic field is subjected to the Fourier transformation as follows.

$$\tilde{H}(k_x, k_y, z, \omega) = \int_{-\infty}^{\infty}\int_{-\infty}^{\infty}\int_{-\infty}^{\infty} e^{-i\omega t + ik_x x + ik_y y} H(x, y, z, t) dx dy dt \quad (2\text{-}6)$$

From the expression (2-5), the following expression is obtained.

$$\sigma_a^{-1}\frac{\partial \tilde{H}_y}{\partial z}\bigg|_{air} = \sigma_c^{-1}\frac{\partial \tilde{H}_y}{\partial z}\bigg|_{\substack{battery\\electrode}} \quad (2\text{-}7)$$

$$\sigma_a^{-1}\frac{\partial \tilde{H}_x}{\partial z}\bigg|_{air} = \sigma_c^{-1}\frac{\partial \tilde{H}_x}{\partial z}\bigg|_{\substack{battery\\electrode}}$$

In this way, the boundary conditions were obtained. When these are summarized once again, it is represented as follows.

$$\tilde{H}_x\bigg|_{\substack{battery\\electrode}} = \tilde{H}_x\bigg|_{air} \quad (2\text{-}8)$$

$$\tilde{H}_y\bigg|_{\substack{battery\\electrode}} = \tilde{H}_y\bigg|_{air}$$

$$\frac{\partial \tilde{H}_x}{\partial z}\bigg|_{\substack{battery\\electrode}} = \frac{\sigma_c}{\sigma_a}\frac{\partial \tilde{H}_x}{\partial z}\bigg|_{air}$$

$$\frac{\partial \tilde{H}_y}{\partial z}\bigg|_{\substack{battery\\electrode}} = \frac{\sigma_c}{\sigma_a}\frac{\partial \tilde{H}_y}{\partial z}\bigg|_{air}$$

Since it is assumed that air is a substance having a virtually non-zero electrical conductivity, consideration should be given on matters that the following expression is established.

$$\Delta H = \sigma_a \mu \frac{\partial}{\partial t} H \quad (2\text{-}9)$$

When this is subjected to the Fourier transformation, it becomes as follows.

$$\left(\frac{d^2}{dz^2} - k_x^2 - k_y^2 - i\omega\sigma_a\mu\right)\tilde{H} = 0 \quad (2\text{-}10)$$

The general solution of this equation is represented as follows.

$$\tilde{H}(k_x,k_y,z,\omega) = a(k_x,k_y,\omega)e^{sz} + b(k_x,k_y,\omega)e^{-sz} \quad (2\text{-}11)$$

Here, s is as follows.

$$s^2 = k_x^2 + k_y^2 + i\omega\sigma\mu \quad (2\text{-}12)$$

$$s = \frac{\sqrt{k_x^2 + k_y^2 + \sqrt{(k_x^2+k_y^2)^2 + \omega^2\sigma^2\mu^2}}}{\sqrt{2}} + i\frac{\sqrt{-k_x^2 - k_y^2 + \sqrt{(k_x^2+k_y^2)^2 + \omega^2\sigma^2\mu^2}}}{\sqrt{2}}$$

a and b are obtained by measuring H=($H_x$, $H_y$, 0) on two planes in the air, each of which has a constant z-coordinate. If the expression (2-11) is used, it is possible to calculate the magnetic field at the boundary surface and its differential required for the boundary condition expression (2-8).

<II-3 Analysis by Inverse Problem Inside Battery>

A target of the inverse problem is written once again. A governing equation of a phenomenon which becomes the target is as follows.

$$\mu\frac{\partial}{\partial t}\Phi = \left\{\frac{(\sigma_c g_e + \sigma_e g_c)}{\sigma_c \sigma_e (g_c + g_e)}\left(\frac{\partial^2}{\partial x^2} + \frac{\partial^2}{\partial y^2}\right) + \frac{g_c + g_e}{\sigma_c g_c + \sigma_e g_e}\frac{\partial^2}{\partial \varsigma^2}\right\}\Phi \quad (3\text{-}1)$$

The differential such as the expression (1-16) is represented by $\varsigma$ instead of z.

$$\frac{\partial}{\partial\varsigma} = \frac{\sigma_c g_c + \sigma_e g_e}{\sigma_c(g_c + g_e)}\frac{\partial}{\partial z} \quad (3\text{-}2)$$

$$\varphi_a(k_x,k_y,0,\omega) = Q_a(k_x,k_y,0,\omega)$$

is representative of the value ($H_x$, $H_y$) of the magnetic field in the air and a known function. From the equation (1-18), the boundary condition is as follows.

$$H_x\bigg|_{\substack{battery\\electrode}} = H_x\bigg|_{air} \quad (3\text{-}3)$$

$$H_y\bigg|_{\substack{battery\\electrode}} = H_y\bigg|_{air}$$

$$\frac{\partial}{\partial\varsigma}H_x\bigg|_{\substack{battery\\electrode}} = \frac{\sigma_c g_c + \sigma_e g_e}{\sigma_a(g_c + g_e)}\frac{\partial}{\partial z}H_x\bigg|_{air}$$

$$\frac{\partial}{\partial\varsigma}H_y\bigg|_{\substack{battery\\electrode}} = \frac{\sigma_c g_c + \sigma_e g_e}{\sigma_a(g_c + g_e)}\frac{\partial}{\partial z}H_y\bigg|_{air}$$

$$\Phi(x, y, \varsigma, t)$$

in the expression (3-1) is the value of $H_x$ or $H_y$ on the surface of the conductor layer.

$$\varphi(k_x, k_y, z, \omega) = \int_{-\infty}^{\infty}\int_{-\infty}^{\infty}\int_{-\infty}^{\infty} e^{-i\omega t + ik_x x + ik_y y} \Phi(x, y, z, t) dx dy dt \quad (3\text{-}4)$$

When the expression (3-1) is subjected to the Fourier transformation, $$\left\{ \frac{g_c + g_e}{\sigma_c g_c + \sigma_e g_e} \frac{d^2}{d\varsigma^2} - \frac{(\sigma_c g_e + \sigma_e g_c)}{\sigma_c \sigma_e (g_c + g_e)}(k_x^2 + k_y^2) - i\omega\mu \right\}\varphi = 0 \quad (3\text{-}5)$$

$$\frac{g_c + g_e}{\sigma_c g_c + \sigma_e g_e} s^2 - \frac{(\sigma_c g_e + \sigma_e g_c)}{\sigma_c \sigma_e (g_c + g_e)}(k_x^2 + k_y^2) - i\omega\mu = 0 \quad (3\text{-}6)$$

are obtained, and when this solution is set as s, the solution of the above expression can be written as follows.

$$\varphi(k_x,k_y,z,\omega) = a(k_x,k_y,\omega)e^{s\varsigma} + b(k_x,k_y,\omega)e^{-s\varsigma} \quad (3\text{-}7)$$

Specifically, s is given by the following expression.

$$s = \sqrt{\frac{\frac{(\sigma_c g_c + \sigma_e g_e)^2(k_x^2+k_y^2)}{\sigma_c\sigma_e(g_c+g_e)^2} + \sqrt{\left(\frac{(\sigma_c g_c+\sigma_e g_e)^2(k_x^2+k_y^2)}{\sigma_c\sigma_e(g_c+g_e)^2}\right)^2 + \left(\frac{\omega\mu(\sigma_c g_c+\sigma_e g_e)}{g_c+g_e}\right)^2}}{\sqrt{2}}} +$$

$$i\sqrt{\frac{-\frac{(\sigma_c g_c + \sigma_e g_e)^2(k_x^2+k_y^2)}{\sigma_c\sigma_e(g_c+g_e)^2} + \sqrt{\left(\frac{(\sigma_c g_c+\sigma_e g_e)^2(k_x^2+k_y^2)}{\sigma_c\sigma_e(g_c+g_e)^2}\right)^2 + \left(\frac{\omega\mu(\sigma_c g_c+\sigma_e g_e)}{g_c+g_e}\right)^2}}{\sqrt{2}}} \quad (3\text{-}8)$$

The a and b are determined using the boundary condition formula (3-3). When it is assumed that the $\varsigma$ coordinate of the surface of the battery is $\varsigma=0$ the following expression is obtained.

$$a(k_x,k_y,\omega) + b(k_x,k_y,\omega) = \varphi(k_x,k_y,0,\omega)$$

$$sa(k_x,k_y,\omega) - sb(k_x,k_y,\omega) = \partial_\varsigma \varphi(k_x,k_y,0,\omega) \quad (3\text{-}9)$$

The following expression is obtained by solving this.

$$a(k_x, k_y, \omega) = \frac{1}{2s}\{s\varphi(k_x, k_y, 0, \omega) + \partial_\varsigma \varphi(k_x, k_y, 0, \omega)\} \quad (3\text{-}10)$$

$$b(k_x, k_y, \omega) = \frac{1}{2s}\{s\varphi(k_x, k_y, 0, \omega) - \partial_\varsigma \varphi(k_x, k_y, 0, \omega)\}$$

The expression (3-7) is subjected to the inverse Fourier transformation.

$$\Phi(x, y, \varsigma, t) = \frac{1}{(2\pi)^3}\int_{-\infty}^{\infty}\int_{-\infty}^{\infty}\int_{-\infty}^{\infty} e^{i\omega t - ik_x x - ik_y y}\varphi(k_x, k_y, \varsigma, \omega) dk_x dk_y d\omega \quad (3\text{-}11)$$

The solution $\rho$ of the inverse problem is given by the following expression.

$$\rho(x, y, \varsigma) = \lim_{t \to 0}\Phi(x, y, \varsigma, t) \quad (3\text{-}12)$$

<II-4 Consideration>
Consider the expression (1-4).

$$\Delta H = \sigma\mu\frac{\partial}{\partial t}H \quad (4\text{-}1)$$

When the flux of the magnetic field as in the following expression is defined, the conductivity $\lambda$ is $1/\sigma\mu$.

$$\begin{pmatrix} F_x \\ F_y \end{pmatrix} = -\frac{1}{\sigma\mu}\nabla\begin{pmatrix} H_x \\ H_y \end{pmatrix} \quad (4\text{-}2)$$

In this case, a continuous expression can be written as follows.

$$\frac{\partial}{\partial t}\begin{pmatrix} H_x \\ H_y \end{pmatrix} + \nabla\begin{pmatrix} F_x \\ F_y \end{pmatrix} = 0 \quad (4\text{-}3)$$

This is a partial differential equation of the expression (4-1). From these physical considerations, it can be seen that the boundary condition is a condition that the flux of the magnetic field is continuous. Since it can be interpreted as $\lambda = \infty$ in the air, $$\left|\nabla_z\begin{pmatrix} H_x \\ H_y \end{pmatrix}\right| = \infty \quad (4\text{-}4)$$

should be established at the boundary between the conductor and the air. However, this is a discussion under the condition that the z differential of the magnetic field in air is not zero. However, since the magnetic field in the air is represented by a harmonic function and the that regarding z is represented by a simple exponential function, when the z differential becomes zero at the boundary surface with the conductor, the z-component of the magnetic field becomes zero in the entire space. Thus, the above expression (4-4) is correct.

Analyzing the inverse problem using the expression (4-4) is somewhat cumbersome due to singularity. Accordingly, air is considered to be a material having a finite minute electrical conductivity, using a penalty method. In this case, since the magnetic field is represented by a regular function having no singularity in the entire space which becomes an analysis target, it is easy to handle and it is also evident that the magnetic field approaches the case of ideal air when the virtual electrical conductivity approaches zero.

<III Basic Theory Assumption of 3D Magnetic Field ($B_x$, $B_y$, $B_z$)>

<III-1 Averaged Basic Equation>

A practical battery has a multilayer structure. Since the existing magnetic imaging technology is a two-dimensional (x-y plane) imaging technology, it was difficult to find out which layer of the multilayer there is an abnormal portion. Image reconstruction has been performed using measured data with DC or at a fixed frequency. In this description, it is aimed at three-dimensional imaging of a battery having a multilayer structure as illustrated in FIG. 6. Magnetic field data at multiple frequencies or impulse response data of the magnetic field is used.

In the following, a quasi-stationary electromagnetic field equation inside the multilayer structure is derived. It is assumed that the electrical conductivity is constant inside each layer. Furthermore, it is assumed that the electrical conductivities of the plurality of electrolytes are equal to each other, the electrical conductivities of the plurality of conductors are equal to each other, and the electrical conductivity of the electrolyte and the electrical conductivity of the conductors are $\sigma_e$ and $\sigma_c$, respectively. The equation about the inside of each layer is represented by Maxwell's equation as follows.

$$\nabla \times E = -\partial_t B$$

$$\nabla \times H = j = \sigma E \quad (5\text{-}1)$$

Next consideration will be given on the boundary condition between two layers. Since consideration is given on the case of a quasi-stationary electromagnetic field in which the electrical conductivity of a conductor is considered to be finite, it is not necessary to consider that the current is concentrated on the boundary surface. Accordingly, the following expression is established.

1 $H_t$ is continuous at boundary surface

2 $E_t$ is continuous at boundary surface $\quad (5\text{-}2)$

Figure 9:
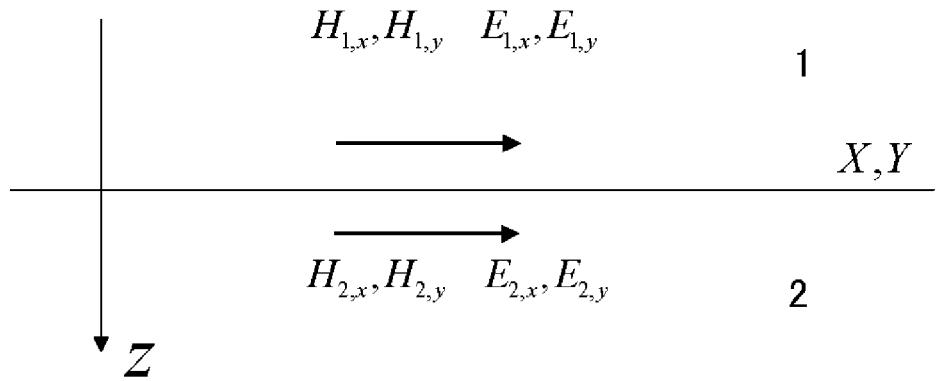
FIG. 9 is a view illustrating a boundary between a layer and a layer.
Figure 10A:
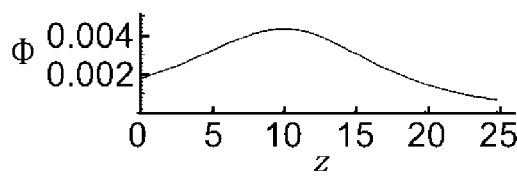
FIGS. 10A to 10D are graphs illustrating examples of a relationship between z and $\Phi$ obtained in a fourth embodiment.
Figure 10B:
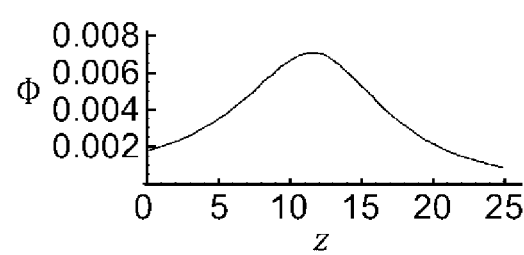
Figure 10C:
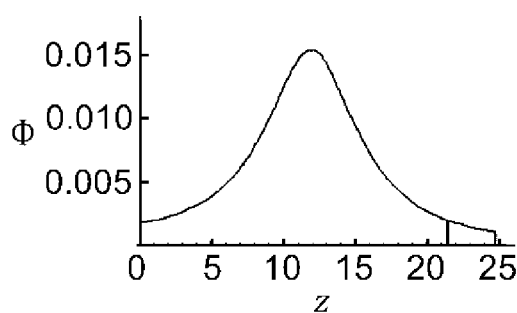
Figure 10D:
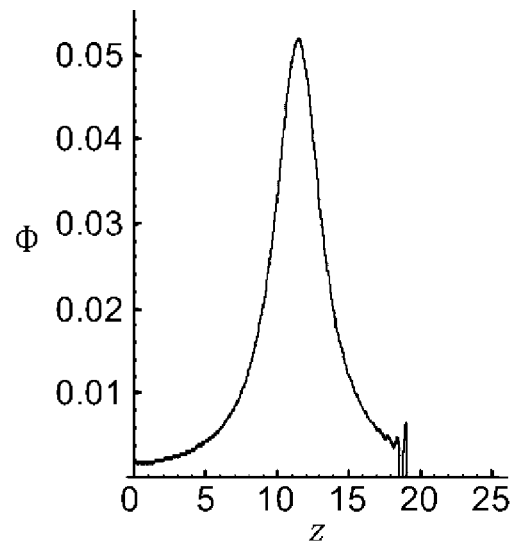

Here, FIG. 9 is a view illustrating a boundary between a layer and a layer. As illustrated in FIG. 9, $H_{1,x}$, $H_{1,y}$, $H_{2,x}$, and $H_{2,y}$ represent the components in the tangential direction of the interface, and $H_{1,z}$ and $H_{2,z}$ indicate the components in the normal direction of the interface, respectively. When it is assumed that the component in the normal direction of the magnetic field is not 0 from the assumption of 3D, it is rewritten by using the expression (5-1), and div (H)=0 is further considered, the expression (5-2) becomes as follows.

1

$$H_{1,x} = H_{2,x}$$

$$H_{1,y} = H_{2,y}$$

$$H_{1,z} = H_{2,z}$$

2

$$(\partial_y H_{1,z} - \partial_z H_{1,y})/\sigma_1 = (\partial_y H_{2,z} - \partial_z H_{2,y})/\sigma_2$$

$$(\partial_z H_{1,x} - \partial_x H_{1,z})/\sigma_1 = (\partial_z H_{2,x} - \partial_x H_{2,z})/\sigma_2$$

$$\partial_z H_{1,z} = \partial_z H_{2,z} \quad (5\text{-}3)$$

An equation of H only inside each layer derived from the expression (5-1) is $$\Delta H = \sigma \mu \frac{\partial}{\partial t} H \quad (5\text{-}4)$$

and when this is subjected to Fourier transformation, the following expression is obtained.

$$Q(k_x, k_y, z, \omega) = \int_{-\infty}^{\infty} \int_{-\infty}^{\infty} \int_{-\infty}^{\infty} e^{-i\omega t + ik_x x + ik_y y} H(x, y, z, t) dx dy dt \quad (5\text{-}5)$$

$$\left(\frac{d^2}{dz^2} - k_x^2 - k_y^2 - i\omega\sigma\mu\right) Q(k_x, k_y, z, \omega) = 0 \quad (5\text{-}6)$$

The general solution of this equation is as follows.

$$Q(k_x, k_y, z, \omega) = c(k_x, k_y, \omega)e^{sz} + c_2(k_x, k_y, \omega)e^{-sz} \quad (5\text{-}7)$$

$c_1$ and $c_2$ are vectors. Here, s is as follows.

$$s^2 = k_x^2 + k_y^2 + i\omega\sigma\mu \quad (5\text{-}8)$$

$$s = \frac{\sqrt{k_x^2 + k_y^2 + \sqrt{(k_x^2 + k_y^2)^2 + \omega^2 \sigma^2 \mu^2}}}{\sqrt{2}} + i\frac{\sqrt{-k_x^2 - k_y^2 + \sqrt{(k_x^2 + k_y^2)^2 + \omega^2 \sigma^2 \mu^2}}}{\sqrt{2}}$$

The following vector is defined. Here, the dot symbol $\dot{Q}$ represents the differential of Q with respect to z.

$$\begin{pmatrix} Q \\ \dot{Q} \end{pmatrix} = \begin{pmatrix} Q_x \\ Q_y \\ Q_z \\ \dot{Q}_x \\ \dot{Q}_y \\ \dot{Q}_z \end{pmatrix}$$

With z=0 and z=z in one layer, the following expression is established. Representation with parameters omitted is used.

$$\begin{pmatrix} Q(0) \\ \dot{Q}(0) \end{pmatrix} = \begin{pmatrix} 1 & 1 \\ s & -s \end{pmatrix} \begin{pmatrix} c_1 \\ c_2 \end{pmatrix} \quad (5\text{-}9)$$

$$\begin{pmatrix} Q(z) \\ \dot{Q}(z) \end{pmatrix} = \begin{pmatrix} e^{sz} & e^{-sz} \\ se^{sz} & -se^{-sz} \end{pmatrix} \begin{pmatrix} c_1 \\ c_2 \end{pmatrix}$$

When ($c_1$, $c_2$) is deleted from this expression, the following expression is obtained.

$$\begin{pmatrix} Q(z) \\ \dot{Q}(z) \end{pmatrix} = \begin{pmatrix} e^{sz} & e^{-sz} \\ se^{sz} & -se^{-sz} \end{pmatrix} \begin{pmatrix} 1/2 & 1/(2s) \\ 1/2 & -1/(2s) \end{pmatrix} \begin{pmatrix} Q(0) \\ \dot{Q}(0) \end{pmatrix} \quad (5\text{-}10)$$

-continued $$= \begin{pmatrix} \cosh(sz) & \sinh(sz)/s \\ s \cdot \sinh(sz) & \cosh(sz) \end{pmatrix} \begin{pmatrix} Q(0) \\ \dot{Q}(0) \end{pmatrix}$$

This expression is applied to the case where the conductor layer and the electrolyte layer are paired as illustrated in FIG. 8. Then, the expression to connect the magnetic field at each layer can be written as follows.

$$\begin{pmatrix} Q_{4x} \\ Q_{4y} \\ Q_{4z} \\ \dot{Q}_{4x} \\ \dot{Q}_{4y} \\ \dot{Q}_{4z} \end{pmatrix} = \begin{pmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & ik_x(\sigma_c/\sigma_e - 1) & \sigma_c/\sigma_e & 0 & 0 \\ 0 & 0 & ik_y(\sigma_c/\sigma_e - 1) & 0 & \sigma_c/\sigma_e & 0 \\ 0 & 0 & 0 & 0 & 0 & 1 \end{pmatrix} \begin{pmatrix} Q_{3x} \\ Q_{3y} \\ Q_{3z} \\ \dot{Q}_{3x} \\ \dot{Q}_{3y} \\ \dot{Q}_{3z} \end{pmatrix} \quad (5\text{-}11)$$

$$\begin{pmatrix} Q_3 \\ \dot{Q}_3 \end{pmatrix} = \begin{pmatrix} \cosh(s_e g_e) & \sinh(s_e g_e)/s_e \\ s_e \cdot \sinh(s_e g_e) & \cosh(s_e g_e) \end{pmatrix} \begin{pmatrix} Q_2 \\ \dot{Q}_2 \end{pmatrix}$$

$$\begin{pmatrix} Q_{2x} \\ Q_{2y} \\ Q_{2z} \\ \dot{Q}_{2x} \\ \dot{Q}_{2y} \\ \dot{Q}_{2z} \end{pmatrix} = \begin{pmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & ik_x(\sigma_e/\sigma_c - 1) & \sigma_e/\sigma_c & 0 & 0 \\ 0 & 0 & ik_y(\sigma_e/\sigma_c - 1) & 0 & \sigma_e/\sigma_c & 0 \\ 0 & 0 & 0 & 0 & 0 & 1 \end{pmatrix} \begin{pmatrix} Q_{1x} \\ Q_{1y} \\ Q_{1z} \\ \dot{Q}_{1x} \\ \dot{Q}_{1y} \\ \dot{Q}_{1z} \end{pmatrix}$$

$$\begin{pmatrix} Q_1 \\ \dot{Q}_1 \end{pmatrix} = \begin{pmatrix} \cosh(s_c g_c) & \sinh(s_c g_c)/s_c \\ s_e \cdot \sinh(s_c g_c) & \cosh(s_c g_c) \end{pmatrix} \begin{pmatrix} Q_0 \\ \dot{Q}_0 \end{pmatrix}$$

Here, the following expression is used.

$$s_e^2 = k_x^2 + k_y^2 + i\omega\sigma_e\mu$$

$$s_c^2 = k_x^2 + k_y^2 + i\omega\sigma_c\mu$$

Here, it is assumed that each layer is thin. Specifically, it is assumed that the following expression is established. Here, it is $$k_x \approx k_y$$

$$s_e g_e \approx \frac{k_x g_e}{\sqrt{2}} \ll 1, \, s_c g_c \approx \frac{k_x g_c}{\sqrt{2}} \ll 1 \quad (5\text{-}12)$$

Leave only the first-order terms of $g_c$ and $g_e$ in the inside of the matrix.

$$\begin{pmatrix} Q_{4x} \\ Q_{4y} \\ Q_{4z} \\ \dot{Q}_{4x} \\ \dot{Q}_{4y} \\ \dot{Q}_{4z} \end{pmatrix} = \begin{pmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & ik_x(\sigma_c/\sigma_e - 1) & \sigma_c/\sigma_e & 0 & 0 \\ 0 & 0 & ik_y(\sigma_c/\sigma_e - 1) & 0 & \sigma_c/\sigma_e & 0 \\ 0 & 0 & 0 & 0 & 0 & 1 \end{pmatrix} \begin{pmatrix} Q_{3x} \\ Q_{3y} \\ Q_{3z} \\ \dot{Q}_{3x} \\ \dot{Q}_{3y} \\ \dot{Q}_{3z} \end{pmatrix} \quad (5\text{-}13)$$

$$\begin{pmatrix} Q_{3x} \\ Q_{3y} \\ Q_{3z} \\ \dot{Q}_{3x} \\ \dot{Q}_{3y} \\ \dot{Q}_{3z} \end{pmatrix} = \begin{pmatrix} 1 & 0 & 0 & g_e & 0 & 0 \\ 0 & 1 & 0 & 0 & g_e & 0 \\ 0 & 0 & 1 & 0 & 0 & g_e \\ s_e^2 g_e & 0 & 0 & 1 & 0 & 0 \\ 0 & s_e^2 g_e & 0 & 0 & 1 & 0 \\ 0 & 0 & s_e^2 g_e & 0 & 0 & 1 \end{pmatrix} \begin{pmatrix} Q_{2x} \\ Q_{2y} \\ Q_{2z} \\ \dot{Q}_{2x} \\ \dot{Q}_{2y} \\ \dot{Q}_{2z} \end{pmatrix}$$

$$\begin{pmatrix} Q_{2x} \\ Q_{2y} \\ Q_{2z} \\ \dot{Q}_{2x} \\ \dot{Q}_{2y} \\ \dot{Q}_{2z} \end{pmatrix} = \begin{pmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & ik_x(\sigma_e/\sigma_c - 1) & \sigma_e/\sigma_c & 0 & 0 \\ 0 & 0 & ik_y(\sigma_e/\sigma_c - 1) & 0 & \sigma_e/\sigma_c & 0 \\ 0 & 0 & 0 & 0 & 0 & 1 \end{pmatrix} \begin{pmatrix} Q_{1x} \\ Q_{1y} \\ Q_{1z} \\ \dot{Q}_{1x} \\ \dot{Q}_{1y} \\ \dot{Q}_{1z} \end{pmatrix}$$

$$\begin{pmatrix} Q_{1x} \\ Q_{1y} \\ Q_{1z} \\ \dot{Q}_{1x} \\ \dot{Q}_{1y} \\ \dot{Q}_{1z} \end{pmatrix} = \begin{pmatrix} 1 & 0 & 0 & g_c & 0 & 0 \\ 0 & 1 & 0 & 0 & g_c & 0 \\ 0 & 0 & 1 & 0 & 0 & g_c \\ s_c^2 g_c & 0 & 0 & 1 & 0 & 0 \\ 0 & s_c^2 g_c & 0 & 0 & 1 & 0 \\ 0 & 0 & s_c^2 g_c & 0 & 0 & 1 \end{pmatrix} \begin{pmatrix} Q_{0x} \\ Q_{0y} \\ Q_{0z} \\ \dot{Q}_{0x} \\ \dot{Q}_{0y} \\ \dot{Q}_{0z} \end{pmatrix}$$

The following notations are used.

$$\begin{pmatrix} Q_4 \\ \dot{Q}_4 \end{pmatrix} = A_{4,2} \begin{pmatrix} Q_2 \\ \dot{Q}_2 \end{pmatrix} \quad (5\text{-}14)$$

$$\begin{pmatrix} Q_2 \\ \dot{Q}_2 \end{pmatrix} = A_{2,1} \begin{pmatrix} Q_0 \\ \dot{Q}_0 \end{pmatrix}$$

$$A_{4,2} = \tag{5-15}$$

$$\begin{pmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & ik_x(\sigma_c/\sigma_e - 1) & \sigma_c/\sigma_e & 0 & 0 \\ 0 & 0 & ik_y(\sigma_c/\sigma_e - 1) & 0 & \sigma_c/\sigma_e & 0 \\ 0 & 0 & 0 & 0 & 0 & 1 \end{pmatrix} \begin{pmatrix} 1 & 0 & 0 & g_e & 0 & 0 \\ 0 & 1 & 0 & 0 & g_e & 0 \\ 0 & 0 & 1 & 0 & 0 & g_{ee} \\ s_e^2 g_e & 0 & 0 & 1 & 0 & 0 \\ 0 & s_e^2 g_e & 0 & 0 & 1 & 0 \\ 0 & 0 & s_e^2 g_e & 0 & 0 & 1 \end{pmatrix} =$$

$$\begin{pmatrix} 1 & 0 & 0 & g_e & 0 & 0 \\ 0 & 1 & 0 & 0 & g_e & 0 \\ 0 & 0 & 1 & 0 & 0 & g_e \\ s_e^2 g_e \sigma_c/\sigma_e & 0 & ik_x(\sigma_c/\sigma_e - 1) & \sigma_c/\sigma_e & 0 & ik_x g_e(\sigma_c/\sigma_e - 1) \\ 0 & s_e^2 g_e \sigma_c/\sigma_e & ik_y(\sigma_c/\sigma_e - 1) & 0 & \sigma_c/\sigma_e & ik_y g_e(\sigma_c/\sigma_e - 1) \\ 0 & 0 & s_e^2 g_e & 0 & 0 & 1 \end{pmatrix}$$

$$A_{2,0} = \begin{pmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & ik_x(\sigma_e/\sigma_c - 1) & \sigma_e/\sigma_c & 0 & 0 \\ 0 & 0 & ik_y(\sigma_e/\sigma_c - 1) & 0 & \sigma_e/\sigma_c & 0 \\ 0 & 0 & 0 & 0 & 0 & 1 \end{pmatrix} \begin{pmatrix} 1 & 0 & 0 & g_c & 0 & 0 \\ 0 & 1 & 0 & 0 & g_c & 0 \\ 0 & 0 & 1 & 0 & 0 & g_c \\ s_c^2 g_c & 0 & 0 & 1 & 0 & 0 \\ 0 & s_c^2 g_c & 0 & 0 & 1 & 0 \\ 0 & 0 & s_c^2 g_c & 0 & 0 & 1 \end{pmatrix} = \tag{5-16}$$

$$\begin{pmatrix} 1 & 0 & 0 & g_c & 0 & 0 \\ 0 & 1 & 0 & 0 & g_c & 0 \\ 0 & 0 & 1 & 0 & 0 & g_c \\ s_c^2 g_c \sigma_e/\sigma_c & 0 & ik_x(\sigma_e/\sigma_c - 1) & \sigma_e/\sigma_c & 0 & ik_x g_c(\sigma_e/\sigma_c - 1) \\ 0 & s_c^2 g_c \sigma_e/\sigma_c & ik_y(\sigma_e/\sigma_c - 1) & 0 & \sigma_e/\sigma_c & ik_y g_c(\sigma_e/\sigma_c - 1) \\ 0 & 0 & s_c^2 g_c & 0 & 0 & 1 \end{pmatrix}$$

The following matrix notation is used.

$$A_{4,0} = A_{4,2} \cdot A_{2,1} \quad (5\text{-}17)$$

In this case, the following expression is established.

$$\begin{pmatrix} Q_4 \\ \dot{Q}_4 \end{pmatrix} = A_{4,0} \begin{pmatrix} Q_0 \\ \dot{Q}_0 \end{pmatrix} \quad (5\text{-}18)$$

$$A_{4,0} = \begin{pmatrix} 1 & 0 & 0 & g_e & 0 & 0 \\ 0 & 1 & 0 & 0 & g_e & 0 \\ 0 & 0 & 1 & 0 & 0 & g_e \\ s_e^2 g_e \sigma_c/\sigma_e & 0 & ik_x(\sigma_c/\sigma_e - 1) & \sigma_c/\sigma_e & 0 & ik_x g_e(\sigma_c/\sigma_e - 1) \\ 0 & s_e^2 g_e \sigma_c/\sigma_e & ik_y(\sigma_c/\sigma_e - 1) & 0 & \sigma_c/\sigma_e & ik_y g_e(\sigma_c/\sigma_e - 1) \\ 0 & 0 & s_e^2 g_e & 0 & 0 & 1 \end{pmatrix} \cdot \quad (5\text{-}19)$$

$$\begin{pmatrix} 1 & 0 & 0 & g_c & 0 & 0 \\ 0 & 1 & 0 & 0 & g_c & 0 \\ 0 & 0 & 1 & 0 & 0 & g_c \\ s_c^2 g_c \sigma_e/\sigma_c & 0 & ik_x(\sigma_e/\sigma_c - 1) & \sigma_e/\sigma_c & 0 & ik_x g_c(\sigma_e/\sigma_c - 1) \\ 0 & s_c^2 g_c \sigma_e/\sigma_c & ik_y(\sigma_e/\sigma_c - 1) & 0 & \sigma_e/\sigma_c & ik_y g_c(\sigma_e/\sigma_c - 1) \\ 0 & 0 & s_c^2 g_c & 0 & 0 & 1 \end{pmatrix} =$$

$$\begin{pmatrix} 1 + s_c^2 g_c g_e \sigma_e/\sigma_c & 0 & ik_x g_e(\sigma_e/\sigma_c - 1) & g_c + g_e \sigma_e/\sigma_c & 0 & ik_x g_c g_e(\sigma_e/\sigma_c - 1) \\ 0 & 1 + s_c^2 g_c g_e \sigma_e/\sigma_c & ik_y g_e(\sigma_e/\sigma_c - 1) & 0 & g_c + g_e \sigma_e/\sigma_c & ik_y g_c g_e(\sigma_e/\sigma_c - 1) \\ 0 & 0 & 1 + s_c^2 g_c g_e & 0 & 0 & g_c + g_e \\ s_e^2 g_e \sigma_c/\sigma_e + s_c^2 g_c & 0 & ik_x g_e g_c s_c^2(\sigma_c/\sigma_e - 1) & s_e^2 g_c g_e \sigma_c/\sigma_e + 1 & 0 & ik_x g_e(\sigma_c/\sigma_e - 1) \\ 0 & s_e^2 g_e \sigma_c/\sigma_e + s_c^2 g_c & ik_y g_e g_c s_c^2(\sigma_c/\sigma_e - 1) & 0 & s_e^2 g_e g_c \sigma_c/\sigma_e + 1 & ik_y g_e(\sigma_c/\sigma_e - 1) \\ 0 & 0 & s_e^2 g_e + s_c^2 g_c & 0 & 0 & s_e^2 g_e g_c + 1 \end{pmatrix}$$

When ignoring terms of second or higher order on $g_e$, $g_c$, the following expression is obtained.

$$A_{4,0} = \begin{pmatrix} 1 & 0 & ik_x g_e(\sigma_e/\sigma_c - 1) & g_c + g_e \sigma_e/\sigma_c & 0 & 0 \\ 0 & 1 & ik_y g_e(\sigma_e/\sigma_c - 1) & 0 & g_c + g_e \sigma_e/\sigma_c & 0 \\ 0 & 0 & 1 & 0 & 0 & g_c + g_e \\ s_e^2 g_e \sigma_c/\sigma_e + s_c^2 g_c & 0 & 0 & 1 & 0 & ik_x g_e(\sigma_c/\sigma_e - 1) \\ 0 & s_e^2 g_e \sigma_c/\sigma_e + s_c^2 g_c & 0 & 0 & 1 & ik_y g_e(\sigma_c/\sigma_e - 1) \\ 0 & 0 & s_e^2 g_e + s_c^2 g_c & 0 & 0 & 1 \end{pmatrix} \quad (5\text{-}20)$$

Under the preparation described above, a macro (averaged) equation relating to the horizontal component of the magnetic field will be derived. The length $\Delta z$ of one unit is given by the following expression.

$$\Delta z = g_c + g_e \quad (5\text{-}21)$$

The following expression (5-22) is established at an extreme limit where $\Delta z$ is small.

$$\partial/\partial z$$

represents the differential of a macro.

$$\frac{\partial}{\partial z}\begin{pmatrix} Q_4 \\ \dot{Q}_4 \end{pmatrix} = \lim_{\Delta z \to 0} \frac{1}{\Delta z}\left[\begin{pmatrix} Q_4 \\ \dot{Q}_4 \end{pmatrix} - \begin{pmatrix} Q_0 \\ \dot{Q}_0 \end{pmatrix}\right] \quad (5\text{-}22)$$

Here, when it is $$Q_4 = Q_0 = \varphi, \dot{Q}_4 = \dot{Q}_0 = \phi,$$

the following expression is established for each component.

$$(g_c + g_e)\frac{\partial}{\partial z}\varphi_1 = ik_x g_e(\sigma_e/\sigma_c - 1)\varphi_3 + (g_c + g_e \sigma_e/\sigma_c)\phi_1 \quad (5\text{-}23)$$

$$(g_c + g_e)\frac{\partial}{\partial z}\varphi_2 = ik_y g_e(\sigma_e/\sigma_c - 1)\varphi_3 + (g_c + g_e \sigma_e/\sigma_c)\phi_2$$

$$(g_c + g_e)\frac{\partial}{\partial z}\varphi_3 = (g_c + g_e)\phi_3$$

$$(g_c + g_e)\frac{\partial}{\partial z}\phi_1 = (s_e^2 g_e \sigma_c/\sigma_e + s_c^2 g_c)\varphi_1 + ik_x g_e(\sigma_c/\sigma_e - 1)\phi_3$$

$$(g_c + g_e)\frac{\partial}{\partial z}\phi_2 = (s_e^2 g_e \sigma_c/\sigma_e + s_c^2 g_c)\varphi_2 + ik_y g_e(\sigma_c/\sigma_e - 1)\phi_3$$

$$(g_c + g_e)\frac{\partial}{\partial z}\phi_3 = (s_e^2 g_e + s_c^2 g_c)\varphi_3$$

When the first, second, and third expressions are differentiated and the fourth, fifth, and sixth expressions are substituted into the expressions, the following expression is obtained.

$$(g_c + g_e)^2 \frac{\partial^2}{\partial z^2}\varphi_1 = [(g_c + g_e\sigma_e/\sigma_c) \quad (5\text{-}24)$$
$$\{g_e\sigma_c(k_x^2 + k_y^2 + i\omega\sigma_e\mu)/\sigma_e + g_c(k_x^2 + k_y^2 + i\omega\sigma_c\mu)\}]\varphi_1 +$$
$$\{ik_x g_e(g_c + g_e)(\sigma_e/\sigma_c - 1) +$$
$$(g_c + g_e\sigma_e/\sigma_c)ik_x g_e(\sigma_c/\sigma_e - 1)\}\frac{\partial}{\partial z}\varphi_3$$

$$(g_c + g_e)^2 \frac{\partial^2}{\partial z^2}\varphi_2 = [(g_c + g_e\sigma_e/\sigma_c)$$
$$\{g_e\sigma_c(k_x^2 + k_y^2 + i\omega\sigma_e\mu)/\sigma_e + g_c(k_x^2 + k_y^2 + i\omega\sigma_c\mu)\}]\varphi_2 +$$
$$\{ik_y g_e(g_c + g_e)(\sigma_e/\sigma_c - 1) +$$
$$(g_c + g_e\sigma_e/\sigma_c)ik_y g_e(\sigma_c/\sigma_e - 1)\}\frac{\partial}{\partial z}\varphi_3$$

$$(g_c + g_e)\frac{\partial^2}{\partial z^2}\varphi_3 = \{g_e(k_x^2 + k_y^2 - i\omega\sigma_e\mu) + g_c(k_x^2 + k_y^2 + i\omega\sigma_c\mu)\}\varphi_3$$

When this is cleaned up, $$(g_c + g_e)^2 \frac{\partial^2}{\partial z^2}\varphi_1 = \quad (5\text{-}25)$$
$$\left\{\frac{(g_c\sigma_c + g_e\sigma_e)(g_e\sigma_c + g_c\sigma_e)}{\sigma_c\sigma_e}(k_x^2 + k_y^2) + (g_c\sigma_c + g_e\sigma_e)\right.$$
$$\left.(g_e + g_c)i\omega\mu\right\}\varphi_1 + \{ik_x g_c(g_c + g_e)(\sigma_e/\sigma_c - 1) +$$
$$(g_c + g_e\sigma_e/\sigma_c)ik_x g_e(\sigma_c/\sigma_e - 1)\}\frac{\partial}{\partial z}\varphi_3$$

$$(g_c + g_e)^2 \frac{\partial^2}{\partial z^2}\varphi_2 = \left\{\frac{(g_c\sigma_c + g_e\sigma_e)(g_e\sigma_c + g_c\sigma_e)}{\sigma_c\sigma_e}(k_x^2 + k_y^2) +\right.$$
$$\left.(g_c\sigma_c + g_e\sigma_e)(g_e + g_c)i\omega\mu\right\}\varphi_2 +$$
$$\{ik_y g_e(g_c + g_e)(\sigma_e/\sigma_c - 1) + (g_c + g_e\sigma_e/\sigma_c)$$
$$ik_y g_e(\sigma_c/\sigma_e - 1)\}\frac{\partial}{\partial z}\varphi_3$$

$$(g_c + g_e)\frac{\partial^2}{\partial z^2}\varphi_3 = \{(g_e + g_c)(k_x^2 + k_y^2) + (g_e\sigma_e + g_c\sigma_c)i\omega\mu\}\varphi_3$$

is obtained and three-dimensional diffusion equations are obtained by inverse Fourier transformation.

$$\mu\frac{\partial}{\partial t}H_x = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_x + \quad (5\text{-}26)$$
$$\frac{g_e g_c(\sigma_c - \sigma_e)^2}{(g_c\sigma_c + g_e\sigma_e)(g_e + g_c)\sigma_c\sigma_e}\frac{\partial^2}{\partial x\partial z}H_z$$

$$\mu\frac{\partial}{\partial t}H_y = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}$$
$$H_y + \frac{g_e g_c(\sigma_c - \sigma_e)^2}{(g_c\sigma_c + g_e\sigma_e)(g_e + g_c)\sigma_c\sigma_e}\frac{\partial^2}{\partial y\partial z}H_z$$

$$\mu\frac{\partial}{\partial t}H_z = \frac{(g_e + g_c)}{(g_e\sigma_e + g_c\sigma_c)}\left(\frac{\partial^2}{\partial x^2} + \frac{\partial^2}{\partial y^2} + \frac{\partial^2}{\partial z^2}\right)H_z$$

The expression (5-26) corresponds to the above expression (11). If it is set that Hz=0 in the first and second of this equation, this equation is the same as the expression (1-21).

<III-2 Boundary Condition Between Air and Battery>

Two sets of boundary conditions are required for each vector element to connect air and metal electrodes of the battery. For that purpose, the integral type of Maxwell's equation is used.

$$\int\int_D \nabla \times E\, dxdy = \oint_{\partial D} E \cdot ds \quad (6\text{-}1)$$
$$= -\partial_t \int\int_D B\, dxdy$$

$$\int\int_D \nabla \times H\, dxdy = \oint_{\partial D} H \cdot ds$$
$$= \int\int_D \sigma E\, dxdy$$

D is two-dimensional area, ∂D is a counterclockwise boundary

If a rectangular area that is thin in the z-direction as the area D is defined with the boundary surface interposed therebetween and double integrals are made to approach 0 first, a condition that the tangential components $E_t$ and $H_t$ are continuous at the boundary surface is obtained. The electric field is not intended to be included in the boundary condition of the equation represented only by the magnetic field. However, in a case where the electrical conductivity is 0, it is $$\nabla \times H = j = \sigma E \quad (6\text{-}2)$$

from the second expression of the expression (5-1), and it is impossible to obtain the condition relating to the differential of H. Accordingly, air is virtually considered as a substance having a small but finite electrical conductivity, not a medium with electrical conductivity of 0 and its electrical conductivity is assumed to be $\sigma_a$. By doing this, the boundary condition that $E_t$ is continuous is represented as follows.

$$\left.\frac{\nabla \times H}{\sigma_a}\right|_t^{air} = \left.\frac{\nabla \times H}{\sigma_c}\right|_t^{battery}_{electrode} \quad (6\text{-}3)$$

This expression can be rewritten as follows.

$$\sigma_a^{-1}\left(\frac{\partial H_z}{\partial y} - \frac{\partial H_y}{\partial z}\right)\bigg|_{air} = \sigma_c^{-1}\left(\frac{\partial H_z}{\partial y} - \frac{\partial H_y}{\partial z}\right)\bigg|_{\substack{battery \\ electrode}} \quad (6\text{-}4)$$

$$\sigma_a^{-1}\left(\frac{\partial H_z}{\partial x} - \frac{\partial H_x}{\partial z}\right)\bigg|_{air} = \sigma_c^{-1}\left(\frac{\partial H_z}{\partial x} - \frac{\partial H_x}{\partial z}\right)\bigg|_{\substack{battery \\ electrode}}$$

The magnetic field is subjected to Fourier transformation as follows.

$$\tilde{H}(k_x, k_y, z, \omega) = \int_{-\infty}^{\infty}\int_{-\infty}^{\infty}\int_{-\infty}^{\infty} e^{-i\omega t + ik_x x + ik_y y} H(x, y, z, t)\, dxdydt \quad (6\text{-}5)$$

From the expression (6-4), the following expression is obtained.

$$\sigma_a^{-1}\left(-ik_y\tilde{H}_z - \frac{\partial \tilde{H}_y}{\partial z}\right)\bigg|_{air} = \sigma_c^{-1}\left(-ik_y\tilde{H}_z - \frac{\partial \tilde{H}_y}{\partial z}\right)\bigg|_{\substack{battery \\ electrode}} \quad (6-6)$$

$$\sigma_a^{-1}\left(-ik_x\tilde{H}_z - \frac{\partial \tilde{H}_x}{\partial z}\right)\bigg|_{air} = \sigma_c^{-1}\left(-ik_x\tilde{H}_z - \frac{\partial \tilde{H}_x}{\partial z}\right)\bigg|_{\substack{battery \\ electrode}}$$

Next, consideration will be given on $H_n(H_z)$. When it is assumed that magnetic permeability is constant, there is the following expression relating to the magnetic field.

$$\text{div } H = 0 \quad (6-7)$$

Accordingly, $H_z$ should be continuous at the boundary surface. Next, consideration will be given on the boundary condition for the z differential of $H_z$. When the expression (6-7) is subjected to Fourier transformation, the following expression is obtained.

$$\frac{\partial}{\partial z}\tilde{H}_z = ik_x\tilde{H}_x + ik_y\tilde{H}_y \quad (6-8)$$

Since the tangential component $H_t$ of the magnetic field is continuous, the right side is continuous at the boundary surface. Accordingly, the differential of the magnetic field $H_z$ is continuous at the boundary surface.

$$\frac{\partial \tilde{H}_z}{\partial z}\bigg|_{air} = \frac{\partial \tilde{H}_z}{\partial z}\bigg|_{\substack{battery \\ electrode}} \quad (6-9)$$

In this way, the boundary conditions were obtained. When these are summarized once again, it is represented as follows.

$$\tilde{H}_x\big|_{\substack{battery \\ electrode}} = \tilde{H}_x\big|_{air} \quad (6-10)$$

$$\tilde{H}_y\big|_{\substack{battery \\ electrode}} = \tilde{H}_y\big|_{air}$$

$$\tilde{H}_z\big|_{\substack{battery \\ electrode}} = \tilde{H}_z\big|_{air}$$

$$\sigma_a^{-1}\left(-ik_y\tilde{H}_z - \frac{\partial \tilde{H}_y}{\partial z}\right)\bigg|_{air} = \sigma_c^{-1}\left(-ik_y\tilde{H}_z - \frac{\partial \tilde{H}_y}{\partial z}\right)\bigg|_{\substack{battery \\ electrode}}$$

$$\sigma_a^{-1}\left(-ik_x\tilde{H}_z - \frac{\partial \tilde{H}_x}{\partial z}\right)\bigg|_{air} = \sigma_c^{-1}\left(-ik_x\tilde{H}_z - \frac{\partial \tilde{H}_x}{\partial z}\right)\bigg|_{\substack{battery \\ electrode}}$$

$$\frac{\partial \tilde{H}_z}{\partial z}\bigg|_{air} = \frac{\partial \tilde{H}_z}{\partial z}\bigg|_{\substack{battery \\ electrode}}$$

The expression (6-10) corresponds to the above expression (10).

Finally, description will be made on changing the equations in the air. Since it is assumed that air is a substance having a virtually non-zero electrical conductivity, consideration should be given on matters that the following expression is established.

$$\Delta H = \sigma_a \mu \frac{\partial}{\partial t} H \quad (6-11)$$

When this is subjected to the Fourier transformation, it becomes as follows.

$$\left(\frac{d^2}{dz^2} - k_x^2 - k_y^2 - i\omega\sigma_a\mu\right)\tilde{H} = 0 \quad (6-12)$$

The general solution of this equation is represented as follows.

$$\tilde{H}(k_x,k_y,z,\omega) = a(k_x,k_y,\omega)e^{sz} + b(k_x,k_y,\omega)e^{-sz} \quad (6-13)$$

Here, s is as follows.

$$s^2 = k_x^2 + k_y^2 + i\omega\sigma\mu \quad (6-14)$$

$$s = \frac{\sqrt{k_x^2 + k_y^2 + \sqrt{(k_x^2+k_y^2)^2 + \omega^2\sigma^2\mu^2}}}{\sqrt{2}} + i\frac{\sqrt{-k_x^2 - k_y^2 + \sqrt{(k_x^2+k_y^2)^2 + \omega^2\sigma^2\mu^2}}}{\sqrt{2}}$$

The expression (6-13) corresponds to the above expression (1)

a and b are obtained by measuring $H=(H_x, H_y, H_z)$ on two planes in the air, each of which has a constant z-coordinate. If the expression (6-13) is used, it is possible to calculate the magnetic field at the boundary surface and its differential required for the boundary condition expression (6-8).

It can be seen from the expressions (5-26) and (6-10) that $H_z$ can be obtained independently from other components. When the result is used, the equations relating to $H_x$ and $H_y$ are obtained from the expression (5-26).

<III-3 Analysis Overview by Inverse Problem Inside Battery>

A target of the inverse problem is written once again. In this section, the macro differential within the battery is represented by the $\zeta$ instead of z. A governing equation of a target phenomenon is as follows inside the battery.

$$\mu\frac{\partial}{\partial t}H_x = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial \zeta^2}\right\}H_x + \quad (7-1)$$

-continued $$\mu \frac{\partial}{\partial t} H_y = \left\{ \frac{(g_e \sigma_c + g_c \sigma_e)}{(g_e + g_c) \sigma_c \sigma_e} \left( \frac{\partial^2}{\partial x^2} + \frac{\partial^2}{\partial y^2} \right) + \frac{(g_c + g_e)}{(g_c \sigma_c + g_e \sigma_e)} \frac{\partial^2}{\partial \varsigma^2} \right\} H_y +$$

$$\frac{g_e g_c (\sigma_c - \sigma_e)^2}{(g_c \sigma_c + g_e \sigma_e)(g_e + g_c) \sigma_c \sigma_e} \frac{\partial^2}{\partial x \partial \varsigma} H_z$$

$$\frac{g_e g_c (\sigma_c - \sigma_e)^2}{(g_c \sigma_c + g_e \sigma_e)(g_e + g_c) \sigma_c \sigma_e} \frac{\partial^2}{\partial y \partial \varsigma} H_z$$

$$\mu \frac{\partial}{\partial t} H_z = \frac{(g_e + g_c)}{(g_e \sigma_e + g_c \sigma_c)} \left( \frac{\partial^2}{\partial x^2} + \frac{\partial^2}{\partial y^2} + \frac{\partial^2}{\partial \varsigma^2} \right) H_z$$

Here, the macro differential such as the expression (5-22) is represented by the $$\varsigma$$

instead of z.

$$\frac{\partial}{\partial \varsigma} = \frac{\sigma_c g_c + \sigma_e g_e}{\sigma_c (g_c + g_e)} \frac{\partial}{\partial z} \quad (7\text{-}2)$$

Here, $$Q_a(k_x, k_y, 0, \omega)$$

is a known function. From the expression (1-16), the boundary condition is as follows.

$$\tilde{H}_x \big|_{\substack{battery \\ electrode}} = \tilde{H}_x \big|_{air} \quad (7\text{-}3)$$

$$\tilde{H}_y \big|_{\substack{battery \\ electrode}} = \tilde{H}_y \big|_{air}$$

$$\tilde{H}_z \big|_{\substack{battery \\ electrode}} = \tilde{H}_z \big|_{air}$$

$$\frac{\partial \tilde{H}_y}{\partial \varsigma} \bigg|_{\substack{battery \\ electrode}} = \frac{\sigma_c}{\sigma_a} \frac{\sigma_c g_c + \sigma_e g_e}{\sigma_a \sigma_a (g_c + g_e)} \left( i k_y \left( 1 - \frac{\sigma_a}{\sigma_c} \right) \tilde{H}_z + \frac{\partial \tilde{H}_y}{\partial z} \right) \bigg|_{air}$$

$$\frac{\partial \tilde{H}_x}{\partial \varsigma} \bigg|_{\substack{battery \\ electrode}} = \frac{\sigma_c}{\sigma_a} \frac{\sigma_c g_c + \sigma_e g_e}{\sigma_a (g_c + g_e)} \left( i k_x \left( 1 - \frac{\sigma_a}{\sigma_c} \right) \tilde{H}_z + \frac{\partial \tilde{H}_x}{\partial z} \right) \bigg|_{air}$$

$$\frac{\partial \tilde{H}_z}{\partial \varsigma} \bigg|_{\substack{battery \\ electrode}} = \frac{\sigma_c g_c + \sigma_e g_e}{\sigma_c (g_c + g_e)} \frac{\partial \tilde{H}_z}{\partial z} \bigg|_{air}$$

The Fourier transformation of the expression (7-1) is represented as follows.

$$i \omega \mu \tilde{H}_x = \left\{ -\frac{(g_e \sigma_c + g_c \sigma_e)}{(g_e + g_c) \sigma_c \sigma_e} (k_x^2 + k_y^2) + \frac{(g_c + g_e)}{(g_c \sigma_c + g_e \sigma_e)} \frac{\partial^2}{\partial \varsigma^2} \right\} \tilde{H}_x - \quad (7\text{-}4)$$

$$i k_x \frac{g_e g_c (\sigma_c - \sigma_e)^2}{(g_c \sigma_c + g_e \sigma_e)(g_e + g_c) \sigma_c \sigma_e} \frac{\partial}{\partial \varsigma} \tilde{H}_z$$

$$i \omega \mu \tilde{H}_y = \left\{ -\frac{(g_e \sigma_c + g_c \sigma_e)}{(g_e + g_c) \sigma_c \sigma_e} (k_x^2 + k_y^2) + \frac{(g_c + g_e)}{(g_c \sigma_c + g_e \sigma_e)} \frac{\partial^2}{\partial \varsigma^2} \right\} H_y -$$

$$i k_y \frac{g_e g_c (\sigma_c - \sigma_e)^2}{(g_c \sigma_c + g_e \sigma_e)(g_e + g_c) \sigma_c \sigma_e} \frac{\partial}{\partial \varsigma} H_z$$

-continued $$i \omega \mu \tilde{H}_z = \frac{(g_e + g_c)}{(g_e \sigma_e + g_c \sigma_c)} \left( -k_x^2 - k_y^2 + \frac{\partial^2}{\partial \varsigma^2} \right) \tilde{H}_z$$

Here, the ordinary differential equation relating to the $$\varsigma$$

can be solved using the boundary condition expression (7-3). Even in the case of a three-dimensional magnetic field, it can be considered as in the case of a two-dimensional magnetic field. However, since there is a term of Hz as a difference, it is included as a special solution. Then, the general solution is set in a form including two unknown functions to satisfy the boundary condition, and these unknown functions can be determined.

Second Embodiment

The configuration of the measurement device 10 according to a second embodiment can be represented using FIG. 1, FIG. 3, and FIG. 4 similarly to the measurement device 10 according to the first embodiment.

The measurement device 10 according to the present embodiment is the same as the measurement device 10 according to the first embodiment except that the processing unit 160 generates three-dimensional magnetic field distribution information on the outside of the laminated body 20 using only information indicating the distribution of the magnetic field on the first plane 201.

The acquisition unit 140 according to the present embodiment may measure only the magnetic field of the first plane 201. Then, the processing unit 160 acquires in-plane distribution information including information indicating the distribution of the magnetic field of the first plane 201 outside the laminated body 20. Here, the in-plane distribution information may not include information indicating the distribution of the magnetic field of the second plane 202.

The processing unit 160 according to the present embodiment includes the outside three-dimensional distribution generation unit 162 and the inside three-dimensional distribution generation unit 164 similarly as in the first embodiment. The outside three-dimensional distribution generation unit 162 generates three-dimensional magnetic field distribution information on the outside of the laminated body 20 by processing the in-plane distribution information.

In a case where the magnetic field (external magnetic field) from the outer side (side opposite to the laminated body 20) than the first plane 201 which is the measurement plane of the magnetic field is sufficiently small, b=0 can be set in the expression (1) of the first embodiment. In that case, if a is obtained based on information indicating the distribution of the magnetic field on one plane, the three-dimensional magnetic field distribution information on the outside of the laminated body 20 can be obtained. Therefore, the acquisition unit 140 does not need to acquire information indicating the distribution of magnetic fields on two planes.

Specifically, in the present embodiment, the three-dimensional magnetic field distribution information on the outside of the laminated body 20 is represented by the following expression (12), and s is represented by the following expression (2). Here, $k_x$ is a wave number in the x-direction of the magnetic field, $k_y$ is the wave number in the y-direction of the magnetic field, z is a z-coordinate, ω is a frequency, σ is electrical conductivity, μ is magnetic permeability, and the following expression (3) is a complex magnetic field vector. In the present embodiment, an outer space of the laminated body 20 is air, σ is the electrical conductivity of air, and μ is the magnetic permeability of air. Then, the outside three-dimensional distribution generation unit 162 obtains vectors a($k_x$, $k_y$, ω) in the equation (12) using information indicating the distribution of the magnetic field of the first plane 201.

$$\tilde{H}(k_x, k_y, z, \omega) = a(k_x, k_y, \omega)e^{sz} \tag{12}$$

$$s = \frac{\sqrt{k_x^2 + k_y^2 + \sqrt{(k_x^2 + k_y^2)^2 + \omega^2 \sigma^2 \mu^2}}}{\sqrt{2}} + i\frac{\sqrt{-k_x^2 - k_y^2 + \sqrt{(k_x^2 + k_y^2)^2 + \omega^2 \sigma^2 \mu^2}}}{\sqrt{2}} \tag{2}$$

$$H(k_x, k_y, z, \omega) \tag{3}$$

That is, the outside three-dimensional distribution generation unit 162 can process as follows. First, the outside three-dimensional distribution generation unit 162 acquires in-plane distribution information. Here, the in-plane distribution information includes information indicating the complex magnetic field vector at each coordinate as described in the first embodiment. It is assumed that the z-coordinate of the first plane 201 is $z_1$ and information indicating the distribution of the magnetic field of the first plane 201 is $$H_1(x,y,z_1,\omega). \tag{4}$$

Then, the outside three-dimensional distribution generation unit 162 obtains $$\tilde{H}_1(k_x,k_y,z_1,\omega) \tag{6}$$

by performing Fourier transformation on the information indicating the distribution of the magnetic field of the first plane 201 with respect to x and y.

Then, the three-dimensional distribution of the complex magnetic field vector represented by the equation (12) is generated as the three-dimensional magnetic field distribution information on the outside of the laminated body 20. Here, a in the equation (12) is a vector satisfying the following expression (13).

$$\tilde{H}_1(k_x,k_y,z,\omega)=a(k_x,k_y,\omega)e^{sz_1} \tag{13}$$

In this manner, the three-dimensional magnetic field distribution information on the outside of the laminated body 20 is generated from the in-plane distribution information including information indicating the response characteristic to the change in the current applied by the current applying unit 120. The three-dimensional magnetic field distribution information on the outside of the laminated body 20 includes the frequency characteristic of the magnetic field. The three-dimensional magnetic field distribution information on the outside of the laminated body 20 is data represented by, for example, a mathematical expression or a table.

The inside three-dimensional distribution generation unit 164 processes the three-dimensional magnetic field distribution information on the outside of the laminated body 20 generated by the outside three-dimensional distribution generation unit 162 in the same manner as described in the first embodiment to generate the three-dimensional magnetic field distribution information on the inside of the laminated body 20 as information on the inside of the laminated body 20.

The processing unit 160 may switch the processing method according to the first embodiment and the processing method according to the second embodiment according to the operation of the user with respect to the measurement device 10.

Next, operations and effects of the present embodiment will be described. In the present embodiment, similarly as in the first embodiment, information on the inside of the laminated body 20 such as a battery can be obtained. Furthermore, it provides useful information for non-destructive failure analysis and the like.

In the present embodiment, it is possible to know the three-dimensional magnetic field distribution inside the laminated body 20 such as a battery. Therefore, it is possible to specifically know the situation inside the laminated body 20.

In addition, since the processing unit 160 can generate the three-dimensional magnetic field distribution information on the outside of the laminated body 20 using only information illustrating the distribution of the magnetic field on the first plane 201, the current applying unit 120 does not need to measure the magnetic field of the second plane 202. Therefore, measurement time can be shortened.

Third Embodiment

Figure 5:
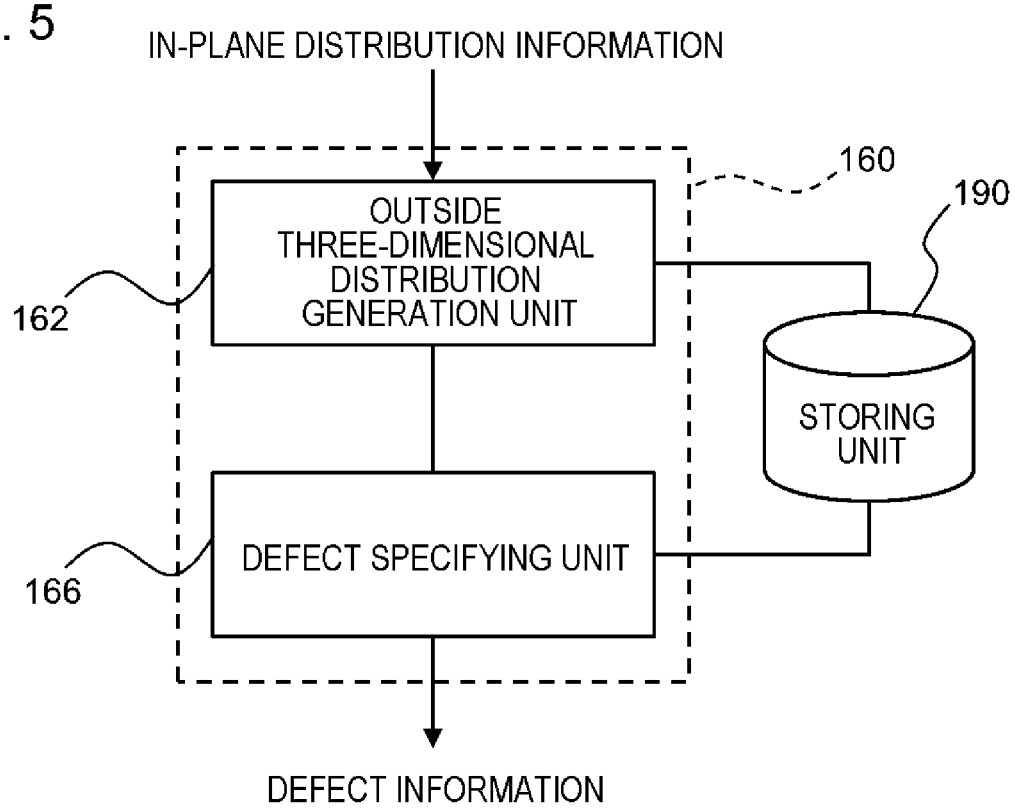
FIG. 5 is a block diagram illustrating a functional configuration of a processing unit according to a third embodiment.

FIG. 5 is a block diagram illustrating a functional configuration of the processing unit 160 according to the third embodiment. The measurement device 10 according to the present embodiment is the same as the measurement device 10 according to the first embodiment or the second embodiment except that the processing unit 160 specifies the position of the defect inside the laminated body 20 based on the three-dimensional magnetic field distribution information on the outside of the laminated body 20.

The processing unit 160 according to the present embodiment includes the outside three-dimensional distribution generation unit 162 and the defect specifying unit 166. The outside three-dimensional distribution generation unit 162 processes the in-plane distribution information acquired by the acquisition unit 140 to generate the three-dimensional magnetic field distribution information on the outside of the laminated body 20. The contents of processing performed by the outside three-dimensional distribution generation unit 162 are the same as those of the measurement device 10 according to the first embodiment or the second embodiment. Then, the defect specifying unit 166 processes the three-dimensional magnetic field distribution information on the outside of the laminated body 20 generated by the outside three-dimensional distribution generation unit 162 to specify the position of the defect inside the laminated body 20 as the information inside the laminated body 20.

More specifically, based on the three-dimensional magnetic field distribution information on the outside of the laminated body 20, the boundary condition between the magnetic fields inside and outside the laminated body 20, and the equation on the magnetic field inside the laminated body 20, the defect specifying unit 166 specifies the position of the defect inside the laminated body 20. Here, the defect is a defect in which a magnetic field of some magnitude is localized.

The boundary condition between the magnetic fields inside and outside the laminated body 20 is represented by the expression (10)

$$\tilde{H}_x|_{inside} = \tilde{H}_x|_{outside} \qquad (10)$$

$$\tilde{H}_y|_{inside} = \tilde{H}_y|_{outside}$$

$$\tilde{H}_z|_{inside} = H_z|_{outside}$$

$$\sigma_a^{-1}\left(-ik_y\tilde{H}_z - \frac{\partial \tilde{H}_y}{\partial z}\right)\bigg|_{outside} = \sigma_c^{-1}\left(-ik_y\tilde{H}_z - \frac{\partial \tilde{H}_y}{\partial z}\right)\bigg|_{inside}$$

$$\sigma_a^{-1}\left(-ik_x\tilde{H}_z - \frac{\partial \tilde{H}_x}{\partial z}\right)\bigg|_{outside} = \sigma_c^{-1}\left(-ik_x\tilde{H}_z - \frac{\partial \tilde{H}_x}{\partial z}\right)\bigg|_{inside}$$

$$\frac{\partial \tilde{H}_z}{\partial z}\bigg|_{outside} = \frac{\partial \tilde{H}_z}{\partial z}\bigg|_{inside}$$

Here, $\tilde{H}_x$ is the x-component of the complex magnetic field vector, $\tilde{H}_y$ is the y-component of the complex magnetic field vector, $\tilde{H}_z$ is the z-component of the complex magnetic field vector, $\sigma_a$ is the electrical conductivity of outside the laminated body 20, and $\sigma_c$ is the electrical conductivity of the first layer 210. Here, the first layer 210 is the outermost layer on the first plane 201 side of the laminated body 20.

In addition, an equation relating to the magnetic field inside the laminated body 20 (time reverse equation) is specifically represented by the following expression (14). Here, $\mu$ is magnetic permeability inside of the laminated body 20, t is time, $H_x$ is a component in the x-direction of the magnetic field, $H_y$ is a component in the y-direction of the magnetic field, $H_z$ is a component in the z-direction of the magnetic field, $g_c$ is a thickness of the first layer 210, $g_e$ is a thickness of the second layer 220, $\sigma_c$ is the electrical conductivity of the first layer 210, and $\sigma_e$ is the electrical conductivity of the second layer 220. The magnetic permeability $\mu$ can be regarded as uniform in the outside of the laminated body 20 and inside the laminated body 20.

$$-\mu\frac{\partial}{\partial t}H_x = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_x + \qquad (14)$$

$$\frac{g_e g_c(\sigma_c - \sigma_e)^2}{(g_c\sigma_c + g_e\sigma_e)(g_e + g_c)\sigma_c\sigma_e}\frac{\partial}{\partial x\partial z}H_z$$

$$-\mu\frac{\partial}{\partial t}H_y = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_y +$$

$$\frac{g_e g_c(\sigma_c - \sigma_e)^2}{(g_c\sigma_c + g_e\sigma_e)(g_e + g_c)\sigma_c\sigma_e}\frac{\partial^2}{\partial y\partial z}H_z$$

$$-\mu\frac{\partial}{\partial t}H_z = \frac{(g_e + g_c)}{(g_e\sigma_e + g_c\sigma_c)}\left(\frac{\partial^2}{\partial x^2} + \frac{\partial^2}{\partial y^2} + \frac{\partial^2}{\partial z^2}\right)H_z$$

The defect specifying unit 166 derives $H_x$, $H_y$, and $H_z$ that satisfy the expression (14) based on the three-dimensional magnetic field distribution information on the outside of the laminated body 20 and the boundary condition between a magnetic field inside and outside of the laminated body 20, and specifies the coordinates at which $H_x$, $H_y$, and $H_z$ diverge as the position of the defect. Specifically, in the boundary condition, the magnetic field outside the laminated body 20 and the differential thereof are derived from the expression (1) of the first embodiment or the expression (12) of the second embodiment. Then, a solution of the expression (14) which is a time reverse equation is obtained. In a case where the coordinates at which the obtained $H_x$, $H_y$, and $H_z$ diverge respectively appear, the coordinates are specified as (x, y, z) coordinates of the defect. Here, the coordinates at which $H_x$, $H_y$, and $H_z$ diverge respectively refer to coordinates at which peaks appear specifically for at least one of $H_x$, $H_y$, and $H_z$ on data. Each mathematical expression will be described later in detail.

Information which indicates the position (coordinates) of the defect and is output from the defect specifying unit 166 is input to the display unit 180, for example. Then, on the display unit 180, data for displaying the position of the defect in the laminated body 20 is generated as an image. Then, it is possible to cause the monitor 390 to display the defect position of the laminated body 20 as an image. In addition, the display unit 180 may output the coordinates of the defect by displaying characters.

The processing unit 160 may output the (x, y, z) coordinates of the defect or may output only the z-coordinate of the defect.

Next, operations and effects of the present embodiment will be described. In the present embodiment, similarly as in the first embodiment and the second embodiment, information on the inside of the laminated body 20 such as a battery can be obtained. Furthermore, it provides useful information for non-destructive failure analysis and the like.

In the present embodiment, it is possible to specify the position of a specific defect.

In the following, analysis of a defect model of the laminated body 20 will be described. In the following description, the laminated body 20 is described as a battery, but the laminated body 20 is not limited to the battery.

<IV 3D Inverse Analysis Simulation of Magnetic Field>
<IV-1 Defect Model>

The expression (5-26) is as follows. Here, a macro variable is written as z.

$$\mu\frac{\partial}{\partial t}H_x = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_x + \qquad (8\text{-}1)$$

$$\frac{g_e g_c(\sigma_c - \sigma_e)^2}{(g_c\sigma_c + g_e\sigma_e)(g_e + g_c)\sigma_c\sigma_e}\frac{\partial^2}{\partial x\partial z}H_z$$

$$\mu\frac{\partial}{\partial t}H_y = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_y +$$

$$\frac{g_e g_c(\sigma_c - \sigma_e)^2}{(g_c\sigma_c + g_e\sigma_e)(g_e + g_c)\sigma_c\sigma_e}\frac{\partial^2}{\partial y\partial z}H_z$$

$$\mu\frac{\partial}{\partial t}H_z = \frac{(g_e + g_c)}{(g_e\sigma_e + g_c\sigma_c)}\left(\frac{\partial^2}{\partial x^2} + \frac{\partial^2}{\partial y^2} + \frac{\partial^2}{\partial z^2}\right)H_z$$

Here, only $H_z$ satisfies an independent equation. When $H_z$ is decided, $H_x$, and $H_y$ can be solved by making it a forced term. Accordingly, the equation relating only to $H_z$ should be considered at first.

$$\mu\frac{\partial}{\partial t}H_z = \frac{(g_e + g_c)}{(g_e\sigma_e + g_c\sigma_c)}\left(\frac{\partial^2}{\partial x^2} + \frac{\partial^2}{\partial y^2} + \frac{\partial^2}{\partial z^2}\right)H_z \qquad (8\text{-}2)$$

The coefficient is set as follows for simplicity.

$$\lambda = \frac{g_c + g_e}{\mu(\sigma_c g_c + \sigma_e g_e)} \quad (8\text{-}3)$$

In this case, the expression (8-1) becomes as follows.

$$\frac{\partial}{\partial t}\Phi = \lambda\left(\frac{\partial^2}{\partial x^2} + \frac{\partial^2}{\partial y^2} + \frac{\partial^2}{\partial z^2}\right)\Phi \quad (8\text{-}4)$$

This equation represents a state in which no magnetic field is generated inside the battery. It is The model when there is a defect is assumed as follows with the analogy of the problem of heat conduction. A model in which defects whose magnitude is proportional to $\Phi_L$ at space time ($t=0$, $x=x_0$, $y=y_0$, $z=z_0$) are localized and the magnetic field leaks is considered.

$$\frac{\partial}{\partial \Phi} = \lambda\left(\frac{\partial^2}{\partial x^2} + \frac{\partial^2}{\partial y^2} + \frac{\partial^2}{\partial z^2}\right)\Phi + \Phi_L \delta(x-x_0)\delta(y-y_0)\delta(z-z_0) \quad (8\text{-}5)$$

$\Phi$ is subjected to the Fourier transformation as follows.

$$\tilde{\Phi}(k_x, k_y, z, \omega) = \int_{-\infty}^{\infty}\int_{-\infty}^{\infty}\int_{-\infty}^{\infty} e^{-i\omega t + ik_x x + ik_y y}\Phi(x, y, z, t)dxdydt$$

From the expression (8-5), the following expression is obtained.

$$i\omega\tilde{\Phi} = \lambda\left(\frac{\partial^2}{\partial z^2} - k_x^2 - k_y^2\right)\tilde{\Phi} + \Phi_L e^{ik_x x_0 + ik_y y_0}\delta(z-z_0) \quad (8\text{-}6)$$

This expression is transformed to obtain the following expression.

$$\lambda\frac{\partial^2}{\partial z^2}\tilde{\Phi} - \{\lambda(k_x^2 + k_y^2) + i\omega\}\tilde{\Phi} = -\Phi_L e^{ik_x x_0 + ik_y y_0}\delta(z-z_0) \quad (8\text{-}7)$$

The following Green function $G_0(z, z_0, k)$ is considered.

$$G_0(z, z_0, s) = \frac{1}{2s}e^{-s|z-z_0|} \quad \frac{\partial^2}{\partial z^2}G_0(z, z_0, s) - s^2 G_0(z, z_0, k) = \delta(z-z_0) \quad (8\text{-}8)$$

The solution of the expression (8-7) is represented as follows.

$$\tilde{\Phi} = -\Phi_L e^{ik_x x_0 + ik_y y_0} G_0(z, z_0, s) + c_1 e^{sz} + c_2 e^{-sz} \quad (8\text{-}9)$$

$$s = \sqrt{k_x^2 + k_y^2 + \frac{i\omega}{\lambda}} = \frac{1}{\sqrt{2}}\sqrt{(k_x^2+k_y^2) + \sqrt{(k_x^2+k_y^2)^2 + \left(\frac{\omega}{\lambda}\right)^2}} +$$

$$\frac{i}{\sqrt{2}}\sqrt{-(k_x^2+k_y^2) + \sqrt{(k_x^2+k_y^2)^2 + \left(\frac{\omega}{\lambda}\right)^2}}$$

$$G_0(z, z_0, s) = \frac{1}{2s}e^{-s|z-z_0|}$$

It is assumed that the differential coefficients $$\tilde{\Phi}_0$$

and $$\dot{\tilde{\Phi}}_0$$

for $\Phi$ and its z on the surface of the battery are given. At the boundary $z=0$, the following expression is established.

$$-\Phi_L e^{ik_x x_0 + ik_y y_0} G_0(0, z_0, s) + c_1 + c_2 = \tilde{\Phi}_0 \quad (8\text{-}10)$$

$$-\Phi_L e^{ik_x x_0 + ik_y y_0} G_0(0, z_0, s) + c_1 - c_2 = \frac{\dot{\tilde{\Phi}}_0}{s}$$

$$G_0(0, z_0, s) = \frac{1}{2s}e^{-sz_0} (\because 0 < z_0)$$

When this expression is solved for $c_1$ and $c_2$, the following expression is obtained.

$$c_1 = \frac{1}{2}\left(\tilde{\Phi}_0 + \frac{\dot{\tilde{\Phi}}_0}{s}\right) + \Phi_L e^{ik_x x_0 + ik_y y_0}\frac{1}{2s}e^{sz_0} \quad (8\text{-}11)$$

$$c_2 = \frac{1}{2}\left(\tilde{\Phi}_0 - \frac{\dot{\tilde{\Phi}}_0}{s}\right)$$

A general solution of the equation (8-5) is obtained as in the expressions (8-9) and (8-11).

<IV-2 Inverse Analysis>

Given a boundary condition (assuming that $c_1=0$, $c_2=0$, that is, there is no magnetic field other than the leak magnetic field)

$$\tilde{\Phi}_0 = -\Phi_L e^{ik_x x_0 + ik_y y_0} G_0(0, z_0, s) \quad (9\text{-}1)$$

$$\dot{\tilde{\Phi}}_0 = -s\Phi_L e^{ik_x x_0 + ik_y y_0} G_0(0, z_0, s)$$

$$G_0(0, z_0, s) = \frac{1}{2s}e^{-sz_0} (0 < z_0)$$

with $z=0$, and consideration is given on the problem of inversely obtaining the second term $$\Phi_L \delta(t)\delta(x-x_0)\delta(y-y_0)\delta(z-z_0) \quad (9\text{-}2)$$

on the right side of the expression (8-4). The equation used for the inverse analysis is the time reverse equation.

$$-\frac{\partial}{\partial t}\Phi = \lambda\left(\frac{\partial^2}{\partial x^2} + \frac{\partial^2}{\partial y^2} + \frac{\partial^2}{\partial z^2}\right)\Phi \quad (9\text{-}3)$$

That is, from the measurement result at t>0, the leak magnetic field ρ(x, y, z) at t=0 is estimated as follows.

$$\rho(x, y, z) = \lim_{t \to +0} \Phi(x, y, z, t) \quad (9\text{-}4)$$

The solution of the equation (9-3) given the boundary condition is easily obtained and is as follows.

$$\Phi = c_1 e^{kz} + c_2 e^{-kz} \quad (9\text{-}5)$$
$$c_1 = \frac{1}{2}\left(\Phi_0 + \frac{\dot{\Phi}_0}{k}\right)$$
$$c_2 = \frac{1}{2}\left(\Phi_0 - \frac{\dot{\Phi}_0}{k}\right)$$

Here, k is a complex conjugate of s and is given by the following expression.

$$\sigma = \frac{g_e \sigma_e + g_c \sigma_c}{g_e + g_c} \quad (9\text{-}6)$$
$$\lambda = \frac{g_c + g_e}{\mu(\sigma_c g_c + \sigma_e g_e)} = \frac{1}{\mu\sigma}$$

$$k = \quad (9\text{-}7)$$
$$\sqrt{k_x^2 + k_y^2 - i\mu\sigma\omega} = \frac{1}{\sqrt{2}}\sqrt{(k_x^2 + k_y^2) + \sqrt{(k_x^2 + k_y^2)^2 + \mu^2\sigma^2\omega^2}} - \frac{i}{\sqrt{2}}\sqrt{-(k_x^2 + k_y^2) + \sqrt{(k_x^2 + k_y^2)^2 + \mu^2\sigma^2\omega^2}}$$

This is subjected to inverse Fourier transformation to obtain $\Phi(x, y, z, t)$ of the expression (9-4).

$$\Phi(x, y, t) = \left(\frac{1}{2\pi}\right)^3 \int_{-\infty}^{\infty}\int_{-\infty}^{\infty}\int_0^{\infty} e^{i\omega t - ik_x x - ik_y y} \tilde{\Phi}(k_x, k_y, z, \omega) dk_x dk_y d\omega \quad (9\text{-}8)$$

<IV-2-1 Case of One-Dimensional $k_x = k_y = 0$>

The following time reverse equation is solved.

$$-\frac{\partial}{\partial t}\Phi + \lambda \frac{\partial^2}{\partial z^2}\Phi \quad (9\text{-}9)$$

Average electrical conductivity is defined as follows.

$$\sigma = \frac{g_e \sigma_e + g_c \sigma_c}{g_e + g_c} \quad (9\text{-}10)$$

s and k can be written as follows.

$$s = \frac{1+i}{\sqrt{2}}\sqrt{\frac{\omega}{\lambda}} = \frac{1+i}{\sqrt{2}}\sqrt{\mu\sigma\omega} \quad (9\text{-}11)$$
$$k = \frac{(1-i)}{\sqrt{2}}\sqrt{\frac{\omega}{\lambda}} = \frac{(1-i)}{\sqrt{2}}\sqrt{\mu\sigma\omega}$$

A defect in the form of the right side of expression (8-5) is set a target. In this case, a magnetic field as in the expression (9-1) is generated at the boundary. At the boundary z=0, the boundary condition is assumed as follows.

$$\Phi_0 = -\Phi_L \frac{1}{2s} e^{-sz_0} \quad (9\text{-}12)$$
$$\dot{\Phi}_0 = -\Phi_L \frac{1}{2} e^{-sz_0}$$

The solution of the expression (9-9) is as follows from the expression (9-5).

$$\Phi = c_1 e^{kz} + c_2 e^{-kz} \quad (9\text{-}13)$$
$$c_1 = \frac{1}{2}\left(\Phi_0 + \frac{\dot{\Phi}_0}{k}\right)$$
$$c_2 = \frac{1}{2}\left(\Phi_0 - \frac{\dot{\Phi}_0}{k}\right)$$

$c_1$ and $c_2$ are as follows.

$$c_1 = \frac{-\Phi_L}{2\sqrt{2}} \frac{1}{\sqrt{\mu\sigma\omega}} e^{-sz_0} \quad (9\text{-}14)$$
$$c_2 = \frac{i\Phi_L}{2\sqrt{2}} \frac{1}{\sqrt{\mu\sigma\omega}} e^{-sz_0}$$

The expression (9-13) is as follows.

$$\tilde{\Phi} = c_1 e^{kz} + c_2 e^{-kz} \quad (9\text{-}15)$$
$$= \frac{\Phi_L}{2\sqrt{2}} \sqrt{\frac{\lambda}{\omega}} (-e^{-sz_0+kz} + ie^{-sz_0-kz})$$
$$= \frac{\Phi_L}{2\sqrt{2}} \sqrt{\frac{1}{\mu\sigma\omega}} [-e^{\sqrt{\frac{\mu\sigma\omega}{2}}\{-(1+i)z_0 + (1-i)z\}} + ie^{\sqrt{\frac{\mu\sigma\omega}{2}}\{-(1+i)z_0 - (1-i)z\}}]$$

The result of inverse analysis is as follows.

$$\Phi(z, t) = \frac{\Phi_L}{2\sqrt{2}} \sqrt{\frac{1}{\mu\sigma}} \quad (9\text{-}16)$$
$$\int_0^{\infty} \frac{-e^{\sqrt{\frac{\mu\sigma\omega}{2}}\{-(1+i)z_0+(1-i)z\}} + ie^{\sqrt{\frac{\mu\sigma\omega}{2}}\{-(1+i)z_0-(1-i)z\}}}{\sqrt{\omega}} e^{i\omega t} d\omega$$

In the specific calculation of inverse analysis, the following ingenuity is necessary.

$$\Phi(z, t) = \frac{\Phi_L}{2\sqrt{2}} \sqrt{\frac{1}{\mu\sigma}} \quad (9\text{-}17)$$
$$\int_0^{\infty} \frac{-e^{\sqrt{\frac{\mu\sigma\omega}{2}}\{-(1+i)z_0(\alpha-i)z\}} + ie^{\sqrt{\frac{\mu\sigma\omega}{2}}\{-(1+i)z_0-(\alpha-i)z\}}}{\sqrt{\omega}} e^{i\omega t} d\omega$$

In inverse analysis, when it is set that $\alpha \ll 1$, it becomes good convergence <IV-2-2 Three Dimension>

Solve the following time reverse equation.

$$-\frac{\partial}{\partial t}\Phi = \lambda\left(\frac{\partial^2}{\partial x^2} + \frac{\partial^2}{\partial y^2} + \frac{\partial^2}{\partial z^2}\right)\Phi \qquad (9\text{-}18)$$

The average electrical conductivity is defined as follows.

$$\sigma = \frac{g_e \sigma_e + g_c \sigma_c}{g_e + g_c} \qquad (9\text{-}19)$$

s and k can be written as follows.

$$s = \sqrt{k_x^2 + k_y^2 - i\mu\sigma\omega} =$$
$$\frac{1}{\sqrt{2}}\sqrt{(k_x^2 + k_y^2) + \sqrt{(k_x^2 + k_y^2)^2 + \mu^2\sigma^2\omega^2}} +$$
$$\frac{i}{\sqrt{2}}\sqrt{-(k_x^2 + k_y^2) + \sqrt{(k_x^2 + k_y^2)^2 + \mu^2\sigma^2\omega^2}} \qquad (9\text{-}20)$$

$$k = \sqrt{k_x^2 + k_y^2 - i\mu\sigma\omega} =$$
$$\frac{1}{\sqrt{2}}\sqrt{(k_x^2 + k_y^2) + \sqrt{(k_x^2 + k_y^2)^2 + \mu^2\sigma^2\omega^2}} -$$
$$\frac{i}{\sqrt{2}}\sqrt{-(k_x^2 + k_y^2) + \sqrt{(k_x^2 + k_y^2)^2 + \mu^2\sigma^2\omega^2}}$$

The defect in the form of the right side of the expression (8-5) is set a target. In this case, a magnetic field as in the expression (9-1) is generated at the boundary. At the boundary z=0, the boundary condition is assumed as follows.

$$\tilde{\Phi}_0 = -\frac{\Phi_L}{2s}e^{ik_x x_0 + ik_y y_0}e^{-sz_0} \qquad (9\text{-}21)$$

$$\dot{\Phi}_0 = -\frac{\Phi_L}{2}e^{ik_x x_0 + ik_y y_0}e^{-sz_0}$$

The solution of the expression (9-9) is as follows from the expression (9-5).

$$\Phi = c_1 e^{kz} + c_2 e^{-kz} \qquad (9\text{-}22)$$

$$c_1 = \frac{1}{2}\left(\tilde{\Phi}_0 + \frac{\dot{\Phi}_0}{k}\right)$$

$$c_2 = \frac{1}{2}\left(\tilde{\Phi}_0 - \frac{\dot{\Phi}_0}{k}\right)$$

The $c_1$ and $c_2$ are as follows.

$$c_1 = \qquad (9\text{-}23)$$
$$-\Phi_L \frac{\sqrt{2}}{4}e^{ik_x x_0 + ik_y y_0}e^{-sz_0}\frac{\sqrt{(k_x^2 + k_y^2) + \sqrt{(k_x^2 + k_y^2)^2 + \mu^2\sigma^2\omega^2}}}{\sqrt{(k_x^2 + k_y^2)^2 + \mu^2\sigma^2\omega^2}}$$

$$c_2 = i\Phi_L\frac{\sqrt{2}}{4}e^{ik_x x_0 + ik_y y_0}e^{-sz_0}$$
$$\frac{\sqrt{-(k_x^2 + k_y^2) + \sqrt{(k_x^2 + k_y^2)^2 + \mu^2\sigma^2\omega^2}}}{\sqrt{(k_x^2 + k_y^2)^2 + \mu^2\sigma^2\omega^2}}$$

The result of inverse analysis is as follows.

$$\tilde{\Phi} = -\Phi_L \frac{\sqrt{2}}{4}e^{ik_x x_0 + ik_y y_0}e^{kz - sz_0} \qquad (9\text{-}24)$$

$$\frac{\sqrt{(k_x^2 + k_y^2) + \sqrt{(k_x^2 + k_y^2)^2 + \mu^2\sigma^2\omega^2}}}{\sqrt{(k_x^2 + k_y^2)^2 + \mu^2\sigma^2\omega^2}} + i\Phi_L\frac{\sqrt{2}}{4}$$

$$e^{ik_x x_0 + ik_y y_0}e^{-sz_0 - kz}\frac{\sqrt{-(k_x^2 + k_y^2) + \sqrt{(k_x^2 + k_y^2)^2 + \mu^2\sigma^2\omega^2}}}{\sqrt{(k_x^2 + k_y^2)^2 + \mu^2\sigma^2\omega^2}}$$

This is subjected to the inverse Fourier transformation to obtain the following expression.

$$\Phi(x, y, z, t) = \Phi_L\left(\frac{1}{2\pi}\right)^3 \int_{-\infty}^{\infty}\int_{-\infty}^{\infty}\int_0^{\infty} e^{i\omega t - ik_x x - ik_y y} \qquad (9\text{-}25)$$
$$\tilde{\Phi}(k_x, k_y, z, \omega)dk_x dk_y d\omega$$

$$= \Phi_L\left(\frac{1}{2\pi}\right)^3 \int_{-\infty}^{\infty}\int_{-\infty}^{\infty}\int_0^{\infty} e^{i\omega t - ik_x(x - x_0) - ik_y(y - y_0)}$$

$$\left\{-\frac{\sqrt{2}}{4}e^{kz - sz_0}\frac{\sqrt{(k_x^2 + k_y^2) + \sqrt{(k_x^2 + k_y^2)^2 + \mu^2\sigma^2\omega^2}}}{\sqrt{(k_x^2 + k_y^2)^2 + \mu^2\sigma^2\omega^2}} + \right.$$
$$\left. i\frac{\sqrt{2}}{4}e^{-kz - sz_0}\frac{\sqrt{-(k_x^2 + k_y^2) + \sqrt{(k_x^2 + k_y^2)^2 + \mu^2\sigma^2\omega^2}}}{\sqrt{(k_x^2 + k_y^2)^2 + \mu^2\sigma^2\omega^2}}\right\}$$

$$dk_x dk_y d\omega$$

As described above, the behavior of the solution of the time reverse equation in the case of having a defect can be understood. The above expression (14) illustrates the time reverse equation for each element of x, y, and z.

Fourth Embodiment

The configuration of the measurement device 10 according to the fourth embodiment can be described with reference to FIG. 5 similarly to the measurement device 10 according to the third embodiment. The measurement device 10 according to the fourth embodiment is the same as the measurement device 10 according to the third embodiment except for the points to be described below. The measurement device 10 according to the fourth embodiment specifies only the depth at which the defect occurs in the laminated body 20.

The processing unit 160 according to the present embodiment includes the outside three-dimensional distribution generation unit 162 and the defect specifying unit 166 similarly as in the third embodiment. The outside three-dimensional distribution generation unit 162 processes the in-plane distribution information acquired by the acquisition unit 140 to generate the three-dimensional magnetic field distribution information on the outside of the laminated body 20. The contents of processing performed by the outside three-dimensional distribution generation unit 162 are the same as those of the measurement device 10 according to the first embodiment or the second embodiment. Then, the defect specifying unit 166 processes the three-dimensional magnetic field distribution information on the outside of the laminated body 20 generated by the outside three-dimensional distribution generation unit 162 to specify the depth (z-coordinate) of the defect inside the laminated body 20 as the information inside the laminated body 20.

More specifically, based on the three-dimensional magnetic field distribution information on the outside of the laminated body 20, the boundary condition between the magnetic fields inside and outside the laminated body 20, and the equation on the magnetic field inside the laminated body 20, the defect specifying unit 166 specifies the depth of the defect inside the laminated body 20. Here, the defect is a defect in which a magnetic field of a certain magnitude is localized.

The boundary condition between the magnetic fields inside and outside the laminated body 20 is represented by the following expression (10).

$$\tilde{H}_x \mid_{inside} = \tilde{H}_x \mid_{outside} \qquad (10)$$

$$\tilde{H}_y \mid_{inside} = \tilde{H}_y \mid_{outside}$$

$$\tilde{H}_z \mid_{inside} = \tilde{H}_z \mid_{outside}$$

$$\sigma_a^{-1}\left(-ik_y \tilde{H}_z - \frac{\partial \tilde{H}_y}{\partial z}\right)\bigg|_{outside} = \sigma_c^{-1}\left(-ik_y \tilde{H}_z - \frac{\partial \tilde{H}_y}{\partial z}\right)\bigg|_{inside}$$

$$\sigma_a^{-1}\left(-ik_x \tilde{H}_z - \frac{\partial \tilde{H}_x}{\partial z}\right)\bigg|_{outside} = \sigma_c^{-1}\left(-ik_x \tilde{H}_z - \frac{\partial \tilde{H}_x}{\partial z}\right)\bigg|_{inside}$$

$$\frac{\partial \tilde{H}_z}{\partial z}\bigg|_{outside} = \frac{\partial \tilde{H}_z}{\partial z}\bigg|_{inside}$$

Here, $\tilde{H}_x$ is the x-component of the complex magnetic field vector, $\tilde{H}_y$ is the y-component of the complex magnetic field vector, $\tilde{H}_z$ is the z-component of the complex magnetic field vector, $\sigma_a$ is the electrical conductivity of outside the laminated body 20, and $\sigma_c$ is the electrical conductivity of the first layer 210. Here, the first layer 210 is the outermost layer on the first plane 201 side of the laminated body 20.

In addition, an equation relating to the magnetic field inside the laminated body 20 (time reverse equation) is specifically represented by the following expression (15). Here, t is the time and Φ is the component in the x-direction or the component in the y-direction of the magnetic field. λ is represented by the following expression (16), μ is the magnetic permeability inside the laminated body 20, $g_c$ is the thickness of the first layer 210, $g_e$ is the thickness of the second layer 220, $\sigma_c$ is the electrical conductivity of the first layer 210, and $\sigma_e$ is the electrical conductivity of the second layer 220. The magnetic permeability μ can be regarded as uniform in the outside of the laminated body 20 and inside the laminated body 20.

$$-\frac{\partial}{\partial t}\Phi = \lambda \frac{\partial^2}{\partial z^2}\Phi \qquad (15)$$

$$\lambda = \frac{g_c + g_e}{\mu(\sigma_c g_c + \sigma_e g_e)} \qquad (16)$$

The expression (15) corresponds to the equation (9-9) indicated in the third embodiment.

Based on the three-dimensional magnetic field distribution information on the outside of the laminated body 20 and the boundary conditions between the magnetic fields inside and outside the laminated body 20, the defect specifying unit 166 derives (satisfying the expression (15) and specifies the coordinates at which (diverges as the position of the defect. Specifically, in the boundary condition, the magnetic field outside the laminated body 20 and the differential thereof are derived from the expression (1) of the first embodiment or the expression (12) of the second embodiment. In the present embodiment, here, by setting $k_x=k_y=0$, the solution of the expression (15) which is the time reverse equation is obtained. Then, in a case where the z-coordinate at which the obtained Φ diverges appears, the coordinate is specified as the z-coordinate of the defect. Here, the z-coordinate at which Φ diverges specifically refers to the z-coordinate at which the peak appears for Φ on data.

Information which indicates the position (coordinates) of the defect and is output from the defect specifying unit 166 is input to the display unit 180, for example. Then, on the display unit 180, data for displaying the position of the defect in the laminated body 20 is generated as an image. Then, it is possible to cause the monitor 390 to display the defect position of the laminated body 20 as an image. In addition, the display unit 180 may output the coordinates of the defect by displaying characters.

FIGS. 10A to 10D are diagrams illustrating examples of the relationship between z and Φ obtained in the fourth embodiment. This figure is a result of simulating the relationship between z and Φ as described in the third embodiment, specifically, it is a graph plotting the relationship between z and Φ using the expression (9-17) In the example of this figure, it is assumed that there is a defect at the position of $z_0=10$, and $\Phi_L=1$ is further assumed. Also, in obtaining this figure, $(\mu\sigma/2)^{1/2}z$ was variable-converted to z. Here, the above expression (9-17) makes analysis easier by replacing (1−i) in the expression (9-16) with (α−i). The value of α is −0.1 in FIG. 10A, −0.3 in FIG. 10B, −0.5 in FIG. 10C, and −0.7 in FIG. 10D.

As illustrated in this figure, a peak of Φ appeared in the vicinity of z=10 assuming that a defect exists. Accordingly, it was confirmed that the depth of the defect can be specified by the method according to the present embodiment. From FIGS. 10A to 10D, it can be understood that when the absolute value of α is increased, resolution is increased. From the simulation results as described above, it can be understood that when any one of the layers in the laminated body 20 has a defect, it is possible to clarify which layer has a defect by the method of the present embodiment.

Next, operations and effects of the present embodiment will be described. In the present embodiment, as in the first embodiment and the second embodiment, information on the inside of the laminated body 20 such as a battery can be obtained. Furthermore, it provides useful information for non-destructive failure analysis and the like.

In the present embodiment, it is possible to specify the depth of a specific defect while reducing the load of information processing. Accordingly, in a case where any layer inside the laminated body 20 such as a battery has a defect, it is possible to specify which layer of the laminated body 20 has a problem.

Although the embodiments of the present invention have been described with reference to the drawings, these are examples of the present invention, and various configurations other than the embodiments described above can be adopted. Further, each of the embodiments described above can be combined within a range in which the contents do not contradict each other. Also, the mathematical expressions described above can be denoted in various ways other than those described above and can be appropriately modified and used.

Hereinafter, an example of a reference form will be appended.

1-1. A measurement device including:
a current applying unit which applies a pulse current or a current of a plurality of frequencies to a laminated body having a structure in which a plurality of layers having different electrical conductivities from each other are laminated;
an acquisition unit which acquires in-plane distribution information including at least information indicating distribution of a magnetic field of a first plane outside the laminated body; and
a processing unit which generates three-dimensional magnetic field distribution information indicating a three-dimensional distribution of magnetic field on an outside of the laminated body based on the in-plane distribution information and generates information on an inside of the laminated body by processing the three-dimensional magnetic field distribution information on the outside of the laminated body,
wherein the in-plane distribution information includes information indicating response characteristics to a change in current applied by the current applying unit, and
the three-dimensional magnetic field distribution information on the outside of the laminated body includes frequency characteristics of a magnetic field.

1-2. In the measurement device described in 1-1,
the laminated body has a structure in which a first layer and a second layer which are different from each other in electrical conductivity are laminated alternately, and
when two directions parallel to the first layer and orthogonal to each other are defined as the x-direction and the y-direction and a direction perpendicular to the x-direction and the y-direction is the z-direction, the first plane is a plane parallel to the xy-plane.

1-3. In the measurement device described in 1-2,
the in-plane distribution information includes at least magnetic field information on a magnetic field for each of a plurality of points in the first plane, and the magnetic field information includes information indicating the response characteristics of the x-component, the y-component, and the z-component of the magnetic field.

1-4. In the measurement device described in 1-3,
the magnetic field information is represented by a complex magnetic field vector.

1-5. In the measurement device described in 1-3 or 1-4,
when $k_x$ is a wave number in the x-direction of the magnetic field, $k_y$ is the wave number in the y-direction of the magnetic field, z is a z-coordinate, ω is a frequency, σ is an electrical conductivity, μ is a magnetic permeability, and the following expression (c1) is a complex magnetic field vector,
the three-dimensional magnetic field distribution information on the outside of the laminated body is represented by the following expression (c2) and s is represented by the following expression (c3), and
the processing unit obtains the vector $a(k_x, k_y, \omega)$ in the expression (c2) using information indicating the distribution of the magnetic field of the first plane.

$$\tilde{H}(k_x, k_y, z, \omega) \tag{c1}$$

$$\tilde{H}(k_x, k_y, z, \omega) = a(k_x, k_y, \omega)e^{sz} \tag{c2}$$

$$s = \frac{\sqrt{k_x^2 + k_y^2 + \sqrt{(k_x^2 + k_y^2)^2 + \omega^2 \sigma^2 \mu^2}}}{\sqrt{2}} + i\frac{\sqrt{-k_x^2 - k_y^2 + \sqrt{(k_x^2 + k_y^2)^2 + \omega^2 \sigma^2 \mu^2}}}{\sqrt{2}} \tag{c3}$$

1-6. In the measurement device described in any one of 1-2 to 1-4,
the in-plane distribution information includes information indicating a distribution of a magnetic field of the first plane and information indicating a distribution of a magnetic field of the second plane, and
the second plane is parallel to the first plane and the z-coordinate of the second plane is different from that of the first plane.

1-7. In the measurement device described in 1-6,
when $k_x$ is a wave number in the x-direction of the magnetic field, $k_y$ is the wave number in the y-direction of the magnetic field, z is a z-coordinate, ω is a frequency, σ is an electrical conductivity, μ is a magnetic permeability, and the following expression (c1) is a complex magnetic field vector,
the three-dimensional magnetic field distribution information on the outside of the laminated body is represented by the following expression (c4) and s is represented by the following expression (c3), and
the processing unit obtains the vector $a(k_x, k_y, \omega)$ and vector $b(k_x, k_y, \omega)$ in the expression (c4) using the information indicating the distribution of the magnetic field of the first plane and the information indicating the distribution of the magnetic field of the second plane.

$$\tilde{H}(k_x, k_y, z, \omega) \tag{c1}$$

$$\tilde{H}(k_x, k_y, z, \omega) = a(k_x, k_y, \omega)e^{sz} + b(k_x, k_y, \omega)e^{-sz} \tag{c4}$$

-continued $$s = \frac{\sqrt{k_x^2 + k_y^2 + \sqrt{(k_x^2 + k_y^2)^2 + \omega^2 \sigma^2 \mu^2}}}{\sqrt{2}} + \qquad (c3)$$

$$i\frac{\sqrt{-k_x^2 - k_y^2 + \sqrt{(k_x^2 + k_y^2)^2 + \omega^2 \sigma^2 \mu^2}}}{\sqrt{2}}$$

1-8. In the measurement device described in any one of 1-2 to 1-7, the processing unit generates the three-dimensional magnetic field distribution information on the inside of the laminated body based on the three-dimensional magnetic field distribution information on the outside of the laminated body.

1-9. In the measurement device described in 1-8, the processing unit generates the three-dimensional magnetic field distribution on the inside of the laminated body based on the three-dimensional magnetic field distribution information on the outside of the laminated body, a boundary condition between the magnetic fields inside and outside the laminated body, and a plurality of relational expressions to be satisfied by the magnetic field inside the laminated body, and when $\mu$ is magnetic permeability, $t$ is time, $H_x$ is a component in the x-direction of the magnetic field, $H_y$ is a component in the y-direction of the magnetic field, $H_z$ is a component in the z-direction of the magnetic field, $g_c$ is the thickness of the first layer, $g_e$ is the thickness of the second layer, $\sigma_c$ is the electrical conductivity of the first layer, and $\sigma_e$ is the electrical conductivity of the second layer, the plurality of relational expressions are the following expression (c5).

$$\mu\frac{\partial}{\partial t}H_x = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_x + \qquad (c5)$$

$$\frac{g_e g_c (\sigma_c - \sigma_e)^2}{(g_c\sigma_c + g_e\sigma_e)(g_e + g_c)\sigma_c\sigma_e}\frac{\partial^2}{\partial x \partial z}H_z$$

$$\mu\frac{\partial}{\partial t}H_y = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_y +$$

$$\frac{g_e g_c (\sigma_c - \sigma_e)^2}{(g_c\sigma_c + g_e\sigma_e)(g_e + g_c)\sigma_c\sigma_e}\frac{\partial^2}{\partial y \partial z}H_z$$

$$\mu\frac{\partial}{\partial t}H_z = \frac{(g_e + g_c)}{(g_e\sigma_e + g_c\sigma_c)}\left(\frac{\partial^2}{\partial x^2} + \frac{\partial^2}{\partial y^2} + \frac{\partial^2}{\partial z^2}\right)H_z$$

1-10. In the measurement device described in any one of 1-2 to 1-9, the processing unit specifies the position of a defect inside the laminated body based on the three-dimensional magnetic field distribution information on the outside of the laminated body.

1-11. In the measurement device described in 1-10, the processing unit specifies a position of the defect inside the laminated body based on the three-dimensional magnetic field distribution information on the outside of the laminated body, the boundary condition between the magnetic fields inside and outside the laminated body, and the equation on the magnetic field inside the laminated body.

1-12. In the measurement device described in 1-11, when $\mu$ is magnetic permeability, $t$ is time, $H_x$ is a component in the x-direction of the magnetic field, $H_y$ is a component in the y-direction of the magnetic field, $H_z$ is a component in the z-direction of the magnetic field, $g_c$ is the thickness of the first layer, $g_e$ is the thickness of the second layer, $\sigma_c$ is the electrical conductivity of the first layer, and $\sigma_e$ is the electrical conductivity of the second layer, the equation is represented by the following expression (c6), and the processing unit derives $H_x$, $H_y$, and $H_z$ that satisfy the expression (c6) based on the three-dimensional magnetic field distribution information on the outside of the laminated body and a boundary condition between magnetic fields inside and outside the laminated body, and specifies the coordinates at which $H_x$, $H_y$, and $H_z$ diverge as the position of the defect.

$$-\mu\frac{\partial}{\partial t}H_x = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_x + \qquad (c6)$$

$$\frac{g_e g_c (\sigma_c - \sigma_e)^2}{(g_c\sigma_c + g_e\sigma_e)(g_e + g_c)\sigma_c\sigma_e}\frac{\partial^2}{\partial x \partial z}H_z$$

$$-\mu\frac{\partial}{\partial t}H_z = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_y +$$

$$\frac{g_e g_c (\sigma_c - \sigma_e)^2}{(g_c\sigma_c + g_e\sigma_e)(g_e + g_c)\sigma_c\sigma_e}\frac{\partial^2}{\partial y \partial z}H_z$$

$$-\mu\frac{\partial}{\partial t}H_z = \frac{(g_e + g_c)}{(g_e\sigma_e + g_c\sigma_c)}\left(\frac{\partial^2}{\partial x^2} + \frac{\partial^2}{\partial y^2} + \frac{\partial^2}{\partial z^2}\right)H_z$$

2-1. A measurement method which includes:

applying a pulse current or a current of a plurality of frequencies to a laminated body having a structure in which a plurality of layers having different electrical conductivities from each other are laminated;

acquiring in-plane distribution information including at least information indicating distribution of a magnetic field of a first plane outside the laminated body; and generating three-dimensional magnetic field distribution information indicating a three-dimensional distribution of magnetic field on an outside of the laminated body based on the in-plane distribution information and generating information on an inside of the laminated body by processing the three-dimensional magnetic field distribution information on the outside of the laminated body, wherein the in-plane distribution information includes information indicating response characteristics to a change in current applied to the laminated body, and the three-dimensional magnetic field distribution information on the outside of the laminated body includes frequency characteristics of a magnetic field.

2-2. In the measurement method described in 2-1, the laminated body has a structure in which a first layer and a second layer which are different from each other in electrical conductivity are laminated alternately, and when two directions parallel to the first layer and orthogonal to each other are defined as the x-direction and the y-direction and a direction perpendicular to the x-direction and the y-direction is the z-direction, the first plane is a plane parallel to the xy-plane.

2-3. In the measurement method described in 2-2, the in-plane distribution information includes magnetic field information on a magnetic field at least for each of a plurality of points in the first plane, and the magnetic field information includes information indicating the response characteristics of the x-component, the y-component, and the z-component of the magnetic field.

2-4. In the measurement method described in 2-3, the magnetic field information is represented by a complex magnetic field vector.

2-5. In the measurement method described in 2-3 or 2-4, when $k_x$ is a wave number in the x-direction of the magnetic field, $k_y$ is the wave number in the y-direction of the magnetic field, z is a z-coordinate, $\omega$ is a frequency, $\sigma$ is an electrical conductivity, $\mu$ is a magnetic permeability, and the following expression (c1) is a complex magnetic field vector, the three-dimensional magnetic field distribution information on the outside of the laminated body is represented by the following expression (c2) and s is represented by the following expression (c3), and the vector $a(k_x, k_y, \omega))$ in the expression (c2) is obtained using information indicating the distribution of the magnetic field of the first plane, $$\tilde{H}(k_x, k_y, z, \omega) \qquad (c1)$$

$$\tilde{H}(k_x, k_y, z, \omega) = a(k_x, k_y, \omega)e^{sz} \qquad (c2)$$

$$s = \frac{\sqrt{k_x^2 + k_y^2 + \sqrt{(k_x^2 + k_y^2)^2 + \omega^2\sigma^2\mu^2}}}{\sqrt{2}} + \qquad (c3)$$

$$i\frac{\sqrt{-k_x^2 - k_y^2 + \sqrt{(k_x^2 + k_y^2)^2 + \omega^2\sigma^2\mu^2}}}{\sqrt{2}}.$$

2-6. In the measurement method described in any one of 2-2 to 2-4, the in-plane distribution information includes information indicating a distribution of a magnetic field of the first plane and information indicating a distribution of a magnetic field of the second plane, and the second plane is parallel to the first plane and the z-coordinate of the second plane is different from that of the first plane.

2-7. In the measurement method described in 2-6, when $k_x$ is a wave number in the x-direction of the magnetic field, $k_y$ is the wave number in the y-direction of the magnetic field, z is a z-coordinate, $\omega$ is a frequency, $\sigma$ is an electrical conductivity, $\mu$ is a magnetic permeability, and the following expression (c1) is a complex magnetic field vector, the three-dimensional magnetic field distribution information on the outside of the laminated body is represented by the following expression (c4) and s is represented by the following expression (c3), and the vector $a(k_x, k_y, \omega))$ and vector $b(k_x, k_y, \omega))$ in the expression (c4) is obtained using the information indicating the distribution of the magnetic field of the first plane and the information indicating the distribution of the magnetic field of the second plane.

$$\tilde{H}(k_x, k_y, z, \omega) \qquad (c1)$$

$$\tilde{H}(k_x, k_y, z, \omega) = a(k_x, k_y, \omega)e^{sz} + b(k_x, k_y, \omega)e^{-sz} \qquad (c4)$$

$$s = \frac{\sqrt{k_x^2 + k_y^2 + \sqrt{(k_x^2 + k_y^2)^2 + \omega^2\sigma^2\mu^2}}}{\sqrt{2}} + \qquad (c3)$$

$$i\frac{\sqrt{-k_x^2 - k_y^2 + \sqrt{(k_x^2 + k_y^2)^2 + \omega^2\sigma^2\mu^2}}}{\sqrt{2}}$$

2-8. In the measurement method described in any one of 2-2 to 2-7, the three-dimensional magnetic field distribution information on the inside of the laminated body is generated based on the three-dimensional magnetic field distribution information on the outside of the laminated body.

2-9. In the measurement method described in 2-8, the three-dimensional magnetic field distribution information on the inside of the laminated body is generated based on the three-dimensional magnetic field distribution information on the outside of the laminated body, a boundary condition between the magnetic fields inside and outside the laminated body, and a plurality of relational expressions to be satisfied by the magnetic field inside the laminated body, and when $\mu$ is magnetic permeability, t is time, $H_x$ is a component in the x-direction of the magnetic field, $H_y$ is a component in the y-direction of the magnetic field, $H_z$ is a component in the z-direction of the magnetic field, $g_c$ is the thickness of the first layer, $g_e$ is the thickness of the second layer, $\sigma_c$ is the electrical conductivity of the first layer, and $\sigma_e$ is the electrical conductivity of the second layer, the plurality of relational expressions are the following expression (c5).

$$\mu\frac{\partial}{\partial t}H_x = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_x + \qquad (c5)$$
$$\frac{g_e g_c(\sigma_c - \sigma_e)^2}{(g_c\sigma_c + g_e\sigma_e)(g_e + g_c)\sigma_c\sigma_e}\frac{\partial^2}{\partial x \partial z}H_z$$

$$\mu\frac{\partial}{\partial t}H_y = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_y +$$
$$\frac{g_e g_c(\sigma_c - \sigma_e)^2}{(g_c\sigma_c + g_e\sigma_e)(g_e + g_c)\sigma_c\sigma_e}\frac{\partial^2}{\partial y \partial z}H_z$$

$$\mu\frac{\partial}{\partial t}H_z = \frac{(g_e + g_c)}{(g_e\sigma_e + g_c\sigma_c)}\left(\frac{\partial^2}{\partial x^2} + \frac{\partial^2}{\partial y^2} + \frac{\partial^2}{\partial z^2}\right)H_z$$

2-10. In the measurement method described in any one of 2-2 to 2-9, the position of the defect inside the laminated body is specified based on the three-dimensional magnetic field distribution information on the outside of the laminated body.

2-11. In the measurement method described in 2-10, the position of the defect inside the laminated body is specified based on the three-dimensional magnetic field distribution information on the outside of the laminated body, the boundary condition between the magnetic fields inside and outside the laminated body, and the equation on the magnetic field inside the laminated body.

2-12. In the measurement method described in 2-11, when $\mu$ is magnetic permeability, t is time, $H_x$ is a component in the x-direction of the magnetic field, $H_y$ is a component in the y-direction of the magnetic field, $H_z$ is a component in the z-direction of the magnetic field, $g_c$ is the thickness of the first layer, $g_e$ is the thickness of the second layer, $\sigma_c$ is the electrical conductivity of the first layer, and $\sigma_e$ is the electrical conductivity of the second layer, the equation is represented by the following expression (c6), $H_x$, $H_y$, and $H_z$ that satisfy the expression (c6) are derived based on the three-dimensional magnetic field distribution information on the outside of the laminated body and a boundary condition between a magnetic field inside and outside of the laminated body, and the coordinates at which $H_x$, $H_y$, and $H_z$ diverge are specified as the position of the defect.

$$-\mu\frac{\partial}{\partial t}H_x = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_x + \quad (c6)$$

$$\frac{g_e g_c (\sigma_c - \sigma_e)^2}{(g_c\sigma_c + g_e\sigma_e)(g_e + g_c)\sigma_c\sigma_e}\frac{\partial^2}{\partial x \partial z}H_z$$

$$-\mu\frac{\partial}{\partial t}H_z = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_y +$$

$$\frac{g_e g_c (\sigma_c - \sigma_e)^2}{(g_c\sigma_c + g_e\sigma_e)(g_e + g_c)\sigma_c\sigma_e}\frac{\partial^2}{\partial y \partial z}H_z$$

$$-\mu\frac{\partial}{\partial t}H_z = \frac{(g_e + g_c)}{(g_e\sigma_e + g_c\sigma_c)}\left(\frac{\partial^2}{\partial x^2} + \frac{\partial^2}{\partial y^2} + \frac{\partial^2}{\partial z^2}\right)H_z$$

This application is based upon and claims the benefit of priority of the prior Japanese Patent Application No. 2016-090128, filed on Apr. 28, 2016, the entire contents of which are incorporated herein by reference.

The invention claimed is:

1. A measurement device comprising:
a current generator which applies a current to a laminated body having a structure in which a plurality of layers having different electrical conductivities from each other are laminated, the current being a pulse current or a current of a plurality of frequencies and is applied to a first electrode to cause the current to flow through the plurality of layers to a second electrode;
a magnetic sensor which acquires in-plane distribution information including at least information indicating distribution of a magnetic field at the plurality of frequencies in a first plane outside the laminated body; and
an information processing device which generates three-dimensional magnetic field distribution information indicating a three-dimensional distribution of magnetic field on an outside of the laminated body based on the in-plane distribution information and generates information on an inside of the laminated body by processing the three-dimensional magnetic field distribution information on the outside of the laminated body,
wherein the in-plane distribution information includes frequency dependent complex data which is information indicating response characteristics to a change in the current at the plurality of frequencies applied by the current generator,
the three-dimensional magnetic field distribution information on the outside of the laminated body includes frequency characteristics of the magnetic field at the plurality of frequencies,
the information processing device specifies a boundary condition between the magnetic fields inside and outside the laminated body, and an equation relating to the magnetic field inside the laminated body, and the equation is an averaged and continuous diffusion type partial differential equation of the laminated body, wherein the information processing device, based on the boundary condition between the magnetic fields inside and outside the laminated body and the frequency characteristics of the magnetic field of the three-dimensional magnetic field distribution information at the plurality of frequencies, derives three-dimensional magnetic field vectors that satisfy the equation, and determines that a position of a defect inside the laminated body is located at a three-dimensional coordinate where the three-dimensional magnetic field vectors diverge, the laminated body is a battery, the plurality of layers include positive electrodes of the battery and negative electrodes of the battery, at least one of the positive electrodes of the battery is electrically connected to the first electrode, and at least one of the negative electrodes of the battery is electrically connected to the second electrode.

2. The measurement device according to claim 1, wherein the laminated body has a structure in which a first layer and a second layer which are different from each other in electrical conductivity are laminated alternately, and when two directions parallel to the first layer and orthogonal to each other are an x-direction and a y-direction and a direction perpendicular to the x-direction and the y-direction is a z-direction, the first plane is a plane parallel to an xy-plane.

3. The measurement device according to claim 2, wherein the in-plane distribution information includes magnetic field information on a magnetic field at least for each of a plurality of points in the first plane and at the plurality of frequencies, and the magnetic field information includes information indicating the response characteristics of an x-component, a y-component, and a z-component of the magnetic field at the plurality of frequencies in the first plane outside the laminated body.

4. The measurement device according to claim 3, wherein the magnetic field information is represented by a complex magnetic field vector.

5. The measurement device according to claim 3, wherein the three-dimensional magnetic field distribution information on the outside of the laminated body at the plurality of frequencies is represented by the following expressions (c1) and (c2), and is represented by the following expression (c3), when $k_x$ is a wave number in the x-direction of the magnetic field, $k_y$ is a wave number in the y-direction of the magnetic field, z is a z-coordinate, ω is a frequency, σ is electrical conductivity, μ is magnetic permeability, and the information processing device obtains the vector $a(k_x, k_y, \omega)$ in the expression (c2) using the information indicating the distribution of the magnetic field at the plurality of frequencies of the first plane, $$\tilde{H}(k_x, k_y, z, \omega) \quad \text{(c1)}$$

$$\tilde{H}(k_x, k_y, z, \omega) = a(k_x, k_y, \omega)e^{sz} \quad \text{(c2)}$$

$$s = \frac{\sqrt{k_x^2 + k_y^2 + \sqrt{(k_x^2 + k_y^2)^2 + \omega^2 \sigma^2 \mu^2}}}{\sqrt{2}} + i\frac{\sqrt{-k_x^2 - k_y^2 + \sqrt{(k_x^2 + k_y^2)^2 + \omega^2 \sigma^2 \mu^2}}}{\sqrt{2}}. \quad \text{(c3)}$$

6. The measurement device according to claim 2,
wherein the in-plane distribution information includes the information indicating distribution of a magnetic field of the first plane and at the plurality of frequencies, and information indicating distribution of a magnetic field of a second plane and at the plurality of frequencies, and the second plane is parallel to the first plane, and the z-coordinate of the second plane is different from that of the first plane.

7. The measurement device according to claim 6,
wherein the three-dimensional magnetic field distribution information on the outside of the laminated body at the plurality of frequencies is represented by the following expressions (c1) and (c4), and s is represented by the following expression (c3), wherein when $k_x$ is a wave number in the x-direction of the magnetic field, $k_y$ is a wave number in the y-direction of the magnetic field, z is a z-coordinate, $\omega$ is a frequency, $\sigma$ is electrical conductivity, $\mu$ is magnetic permeability, and the information processing device obtains the vector $a(k_x, k_y, \omega)$ and vector $b(k_x, k_y, \omega)$ in the expression (c4) using the information indicating the distribution of the magnetic field of the first plane at the plurality of frequencies and the information indicating the distribution of the magnetic field of the second plane at the plurality of frequencies, $$\tilde{H}(k_x, k_y, z, \omega) \quad \text{(c1)}$$

$$\tilde{H}(k_x, k_y, z, \omega) = a(k_x, k_y, \omega)e^{sz} + b(k_x, k_y, \omega)e^{-sz} \quad \text{(c4)}$$

$$s = \frac{\sqrt{k_x^2 + k_y^2 + \sqrt{(k_x^2 + k_y^2)^2 + \omega^2 \sigma^2 \mu^2}}}{\sqrt{2}} + i\frac{\sqrt{-k_x^2 - k_y^2 + \sqrt{(k_x^2 + k_y^2)^2 + \omega^2 \sigma^2 \mu^2}}}{\sqrt{2}}. \quad \text{(c3)}$$

8. The measurement device according to claim 2,
wherein the information processing device generates the three-dimensional magnetic field distribution information on the inside of the laminated body based on the three-dimensional magnetic field distribution information on the outside of the laminated body at the plurality of frequencies.

9. The measurement device according to claim 8,
wherein the information processing device generates the three-dimensional magnetic field distribution information on the inside of the laminated body based on the three-dimensional magnetic field distribution information on the outside of the laminated body at the plurality of frequencies, the boundary condition between the magnetic fields inside and outside the laminated body at the plurality of frequencies, and a plurality of relational expressions to be satisfied by the magnetic field inside the laminated body at the plurality of frequencies, and when $\mu$ is magnetic permeability, t is time, $H_x$ is a component in the x-direction of the magnetic field, $H_y$ is a component in the y-direction of the magnetic field, $H_z$ is a component in the z-direction of the magnetic field, $g_c$ is a thickness of the first layer, $g_e$ is a thickness of the second layer, $\sigma_c$ is the electrical conductivity of the first layer, and $\sigma_e$ is the electrical conductivity of the second layer, the plurality of relational expressions are the following expression (c5), $$\mu \frac{\partial}{\partial t} H_x = \left\{ \frac{(g_e \sigma_c + g_c \sigma_e)}{(g_e + g_c)\sigma_c \sigma_e} \left( \frac{\partial^2}{\partial x^2} + \frac{\partial^2}{\partial y^2} \right) + \frac{(g_c + g_e)}{(g_c \sigma_c + g_e \sigma_e)} \frac{\partial^2}{\partial z^2} \right\} H_x \quad \text{(c5)}$$
$$+ \frac{g_e g_c (\sigma_c - \sigma_e)^2}{(g_c \sigma_c + g_e \sigma_e)(g_e + g_c)\sigma_c \sigma_e} \frac{\partial^2}{\partial x \partial z} H_z$$

$$\mu \frac{\partial}{\partial t} H_y = \left\{ \frac{(g_e \sigma_c + g_c \sigma_e)}{(g_e + g_c)\sigma_c \sigma_e} \left( \frac{\partial^2}{\partial x^2} + \frac{\partial^2}{\partial y^2} \right) + \frac{(g_c + g_e)}{(g_c \sigma_c + g_e \sigma_e)} \frac{\partial^2}{\partial z^2} \right\} H_y$$
$$+ \frac{g_e g_c (\sigma_c - \sigma_e)^2}{(g_c \sigma_c + g_e \sigma_e)(g_e + g_c)\sigma_c \sigma_e} \frac{\partial^2}{\partial y \partial z} H_z$$

$$\mu \frac{\partial}{\partial t} H_z = \frac{(g_e + g_c)}{(g_e \sigma_e + g_c \sigma_c)} \left( \frac{\partial^2}{\partial x^2} + \frac{\partial^2}{\partial y^2} + \frac{\partial^2}{\partial z^2} \right) H_z.$$

10. The measurement device according to claim 2,
wherein the information processing device generates the three-dimensional magnetic field distribution information on the inside of the laminated body based on the three-dimensional magnetic field distribution information on the outside of the laminated body at the plurality of frequencies, the boundary condition between the magnetic fields inside and outside the laminated body at the plurality of frequencies, and a plurality of relational expressions to be satisfied by the magnetic field inside the laminated body at the plurality of frequencies, and wherein when $\mu$ is magnetic permeability, t is time, $H_x$ is a component in the x-direction of the magnetic field, $H_y$ is a component in the y-direction of the magnetic field, $H_z$ is a component in the z-direction of the magnetic field, $g_c$ is the thickness of the first layer, $g_e$ is the thickness of the second layer, $\sigma_c$ is the electrical conductivity of the first layer, and $\sigma_e$ is the electrical conductivity of the second layer, the plurality of relational expressions are the following expression (c6), $$-\mu \frac{\partial}{\partial t} H_x = \left\{ \frac{(g_e \sigma_c + g_c \sigma_e)}{(g_e + g_c)\sigma_c \sigma_e} \left( \frac{\partial^2}{\partial x^2} + \frac{\partial^2}{\partial y^2} \right) + \frac{(g_c + g_e)}{(g_c \sigma_c + g_e \sigma_e)} \frac{\partial^2}{\partial z^2} \right\} H_x \quad \text{(c6)}$$
$$+ \frac{g_e g_c (\sigma_c - \sigma_e)^2}{(g_c \sigma_c + g_e \sigma_e)(g_e + g_c)\sigma_c \sigma_e} \frac{\partial^2}{\partial x \partial z} H_z$$

-continued $$-\mu\frac{\partial}{\partial t}H_y = \left\{\frac{(g_e\sigma_c + g_c\sigma_e)}{(g_e + g_c)\sigma_c\sigma_e}\left(\frac{\partial^2}{\partial x^2} + \frac{\partial^2}{\partial y^2}\right) + \frac{(g_c + g_e)}{(g_c\sigma_c + g_e\sigma_e)}\frac{\partial^2}{\partial z^2}\right\}H_y$$
$$+ \frac{g_e g_c(\sigma_c - \sigma_e)^2}{(g_c\sigma_c + g_e\sigma_e)(g_e + g_c)\sigma_c\sigma_e}\frac{\partial^2}{\partial y \partial z}H_z$$
$$-\mu\frac{\partial}{\partial t}H_z = \frac{(g_e + g_c)}{(g_e\sigma_e + g_c\sigma_c)}\left(\frac{\partial^2}{\partial x^2} + \frac{\partial^2}{\partial y^2} + \frac{\partial^2}{\partial z^2}\right)H_z.$$

11. A measurement method comprising:

applying a current to a laminated body having a structure in which a plurality of layers having different electrical conductivities from each other are laminated, where the applying the current comprises a pulse current or a current of a plurality of frequencies and is applied to a first electrode to cause the current to flow through the plurality of layers to a second electrode, and wherein the laminated body comprises a battery and the plurality of layers include positive electrodes of the battery and negative electrodes of the battery;

acquiring in-plane distribution information including at least information indicating distribution of a magnetic field at the plurality of frequencies in a first plane outside the laminated body; and generating three-dimensional magnetic field distribution information indicating a three-dimensional distribution of magnetic field on an outside of the laminated body based on the in-plane distribution information and generating information on an inside of the laminated body by processing the three-dimensional magnetic field distribution information on the outside of the laminated body, wherein the in-plane distribution information includes frequency dependent complex data which is information indicating response characteristics to a change in current at the plurality of frequencies applied to the laminated body, the three-dimensional magnetic field distribution information on the outside of the laminated body includes frequency characteristics of the magnetic field at the plurality of frequencies, in the generating of the information on the inside of the laminated body, a boundary condition between the magnetic fields inside and outside the laminated body, and an equation relating to the magnetic field inside the laminated body are specified, the equation is an averaged and continuous diffusion type partial differential equation of the laminated body; and based on the boundary condition between the magnetic fields inside and outside the laminated body and the frequency characteristics of the magnetic field at the plurality of frequencies of the three-dimensional magnetic field distribution information, deriving three-dimensional magnetic field vectors that satisfy the equation, and determining that a position of a defect inside the laminated body is located at a three-dimensional coordinate where the three-dimensional magnetic field vectors diverge, electrically connecting at least one of the positive electrodes of the battery to the first electrode, and electrically connecting at least one of the negative electrodes of the battery to the second electrode.

* * * * *